(12) United States Patent
Kadota et al.

(10) Patent No.: US 7,876,021 B2
(45) Date of Patent: Jan. 25, 2011

(54) SURFACE ACOUSTIC WAVE DEVICE INCLUDING AN IDT DEFINED BY A METAL FILLED IN GROOVES IN A PIEZOELECTRIC SUBSTRATE

(75) Inventors: Michio Kadota, Kyoto (JP); Takeshi Nakao, Omihachiman (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 12/629,924

(22) Filed: Dec. 3, 2009

(65) Prior Publication Data
US 2010/0072856 A1 Mar. 25, 2010

Related U.S. Application Data

(63) Continuation of application No. PCT/JP2008/058041, filed on Apr. 25, 2008.

(30) Foreign Application Priority Data
Jun. 6, 2007 (JP) ............................. 2007-150664

(51) Int. Cl.
*H01L 41/04* (2006.01)
(52) U.S. Cl. ............................. 310/313 B; 310/313 R
(58) Field of Classification Search .............. 310/313 B, 310/313 R
See application file for complete search history.

(56) References Cited

U.S. PATENT DOCUMENTS

| | | | | |
|---|---|---|---|---|
| 4,600,905 A | * | 7/1986 | Fredricksen | ................. 333/196 |
| 4,879,487 A | * | 11/1989 | Sugai et al. | ............. 310/313 A |
| 7,418,772 B2 | | 9/2008 | Nishiyama et al. | |
| 7,425,788 B2 | | 9/2008 | Kadota et al. | |
| 7,626,313 B2 | * | 12/2009 | Yaoi et al. | ................ 310/313 B |
| 7,629,866 B2 | * | 12/2009 | Kadota et al. | ................ 333/193 |
| 2004/0164644 A1 | | 8/2004 | Nishiyama et al. | |
| 2007/0120439 A1 | | 5/2007 | Kadota et al. | |
| 2008/0303379 A1 | * | 12/2008 | Nakai et al. | ............. 310/313 R |
| 2009/0085429 A1 | * | 4/2009 | Nishiyama et al. | ...... 310/313 A |
| 2009/0189483 A1 | * | 7/2009 | Kadota et al. | ........... 310/313 B |

FOREIGN PATENT DOCUMENTS

| | | | |
|---|---|---|---|
| JP | 2004-172990 A | | 6/2004 |
| JP | 2006-270906 A | | 10/2006 |
| JP | 2009194895 A | * | 8/2009 |
| WO | WO 2007080734 A1 | * | 7/2007 |
| WO | WO 2008004408 A1 | * | 1/2008 |

OTHER PUBLICATIONS

Machine translation of JP 2006-270906A (Oct. 2006).*
Official Communication issued in International Patent Application No. PCT/JP2008/058041, mailed on Aug. 12, 2008.

* cited by examiner

*Primary Examiner*—J. SanMartin
(74) *Attorney, Agent, or Firm*—Keating & Bennett, LLP

(57) ABSTRACT

A surface acoustic wave device includes a $LiTaO_3$ substrate, and an IDT having a high reflection coefficient, which has a relatively high electromechanical coupling coefficient $k^2$, and which can obtain superior resonance characteristics and/or filter characteristics. In a surface acoustic wave device in which a plurality of grooves is provided in an upper surface of a $LiTaO_3$ substrate and an IDT having a plurality of electrode fingers made of a metal filled in the plurality of grooves, the following equation is satisfied:
$(\rho^3 \times C_{44})^{1/2} > 1.95 \times 10^{11}$, where $\rho$ represents the density of the metal defining the IDT, and $C_{44}$ represents the stiffness thereof.

5 Claims, 16 Drawing Sheets

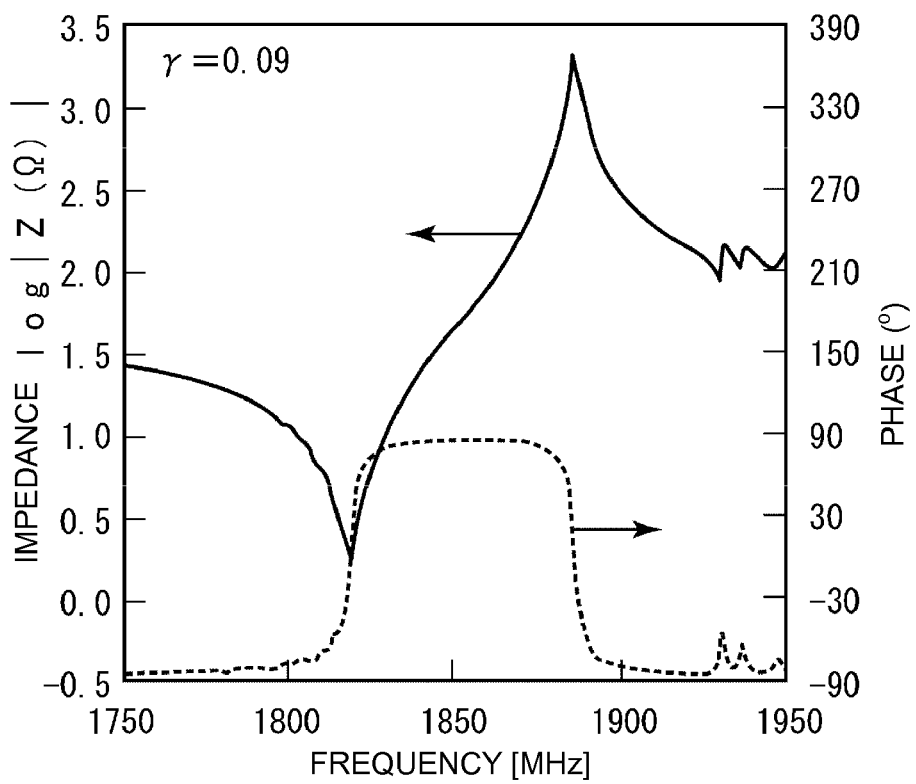
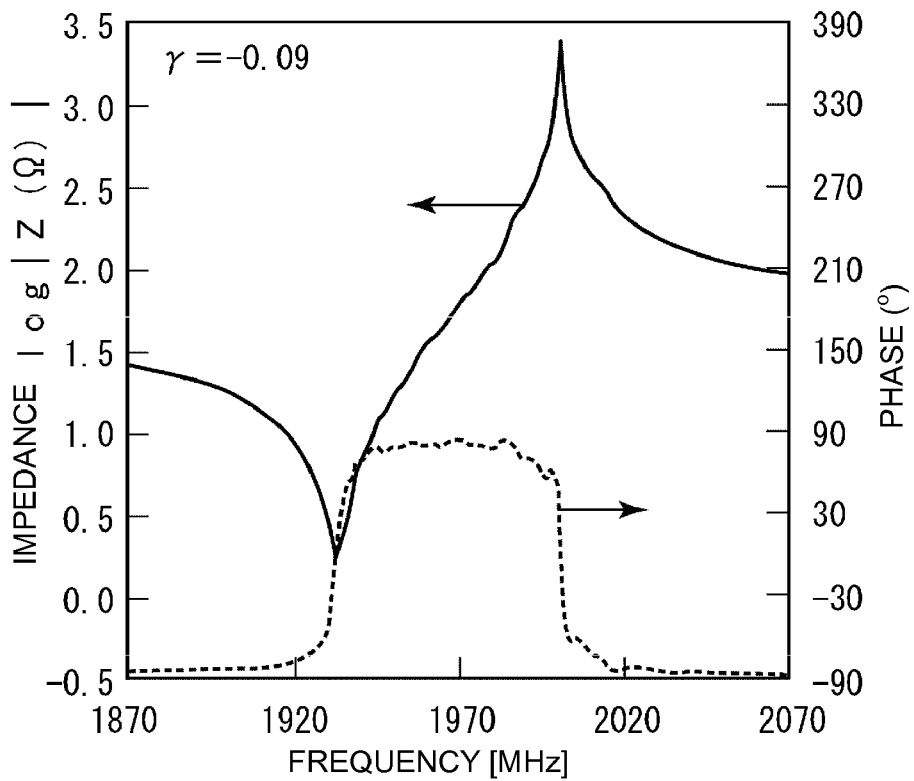

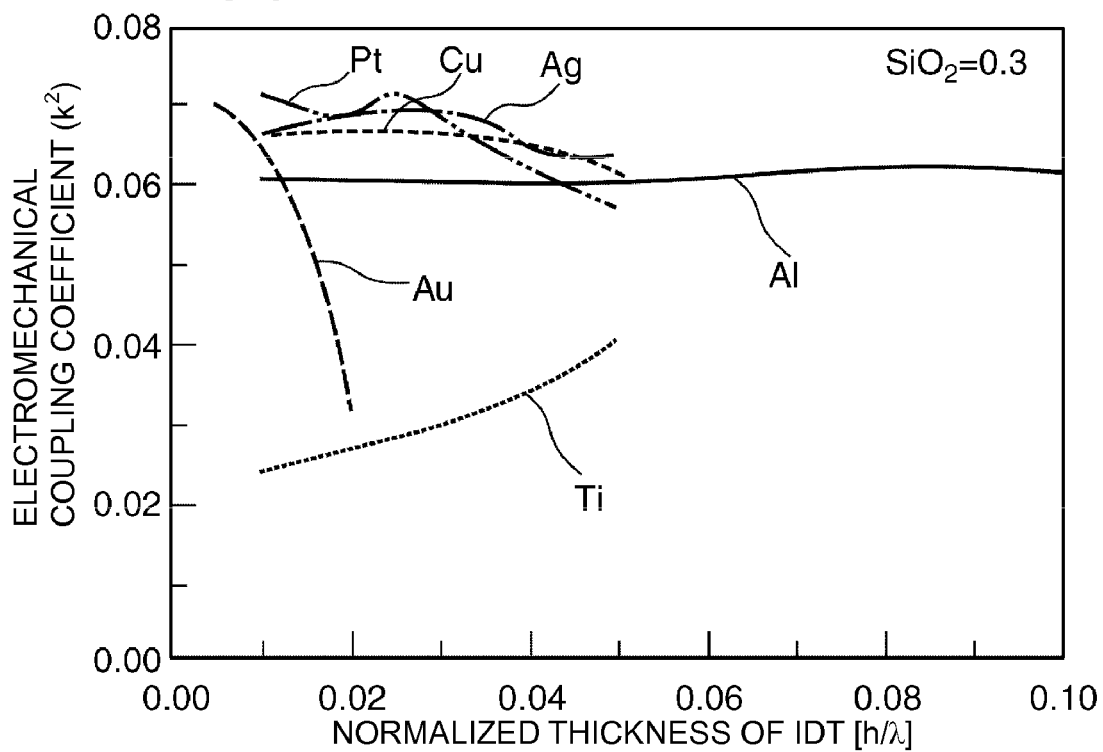
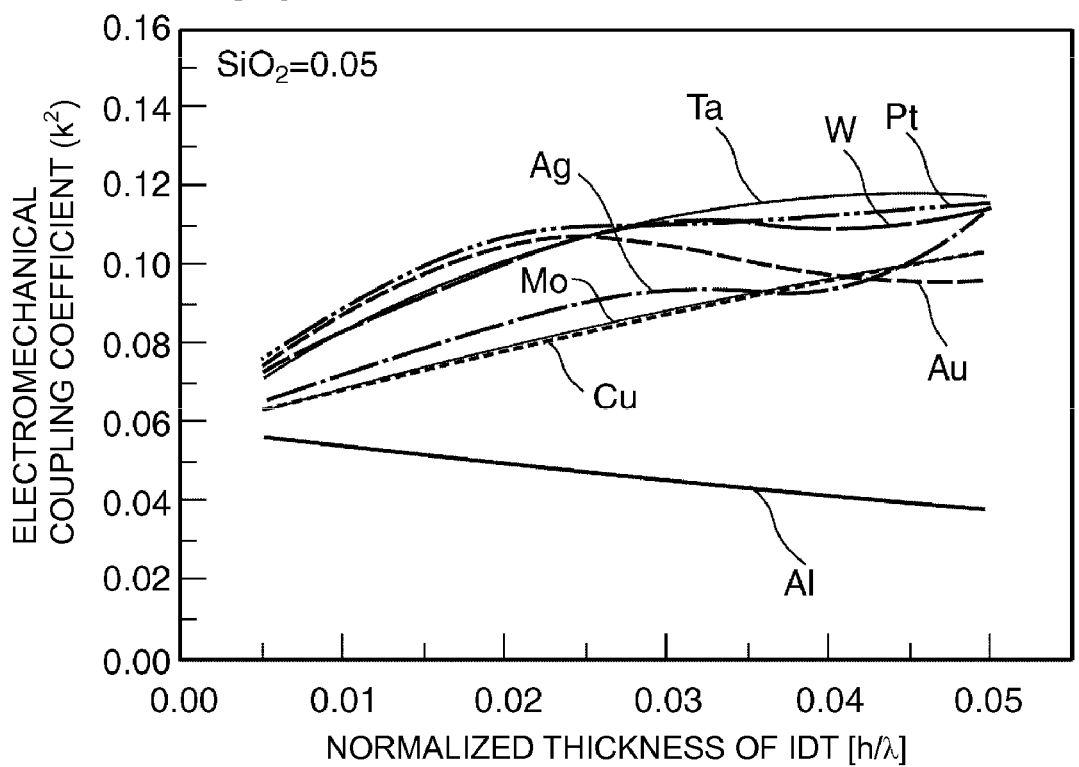

SURFACE ACOUSTIC WAVE DEVICE INCLUDING AN IDT DEFINED BY A METAL FILLED IN GROOVES IN A PIEZOELECTRIC SUBSTRATE

BACKGROUND OF THE INVENTION

1. Field of the Invention

The present invention relates to a surface acoustic wave device which is used as a resonator or a bandpass filter. Particularly, the present invention relates to a surface acoustic wave device including an IDT that is defined by a metal that is filled in grooves provided in a piezoelectric substrate.

2. Description of the Related Art

Surface acoustic wave devices have been widely used as a resonator and a bandpass filter. For example, WO2006/011417A1 discloses a surface acoustic wave device 1001 having a cross-sectional structure as schematically shown in FIG. 30. In the surface acoustic wave device 1001, a plurality of grooves 1002b is formed in an upper surface 1002a of a LiTaO$_3$ substrate 1002. A metal is filled in the plurality of grooves 1002b, and an IDT 1003 having a plurality of electrode fingers is formed from the metal filled in the plurality of grooves 1002b. A SiO$_2$ film 1004 is laminated so as to cover the upper surface 1002a of the LiTaO$_3$ substrate 1002. Since the LiTaO$_3$ substrate 1002 has a negative temperature coefficient of frequency TCF, the SiO$_2$ film 1004 having a positive temperature coefficient of frequency TCF is laminated, and as a result, the absolute value of the temperature coefficient of frequency TCF of the surface acoustic wave device 1001 is decreased. In addition, since the IDT is formed using the metal filled in the plurality of grooves 1002b, a high reflection coefficient can be obtained in the IDT. In particular, when the wavelength of a surface acoustic wave is represented by $\lambda$, and when the thickness of Al filled in the grooves 1002b, that is, the thickness of the IDT made of Al, is set to 0.04$\lambda$, the reflection coefficient per electrode finger is 0.05, and a higher reflection coefficient can be obtained as the electrode thickness is increased.

Japanese Unexamined Patent Application Publication No. 2004-112748 discloses a surface acoustic wave device shown in FIG. 31. In a surface acoustic wave device 1101, an IDT 1103 is provided on a piezoelectric substrate 1102 made of LiTaO$_3$ or LiNbO$_3$. In addition, a protective film 1104 is arranged so as to cover the IDT 1103. Furthermore, in a remaining region other than a region in which the IDT 1103 and the protective film 1104 are provided, a first insulating layer 1105 made of SiO$_2$ is formed to have a thickness equal to that of a laminated metal film in which the IDT 1103 and the protective film 1104 are laminated to each other. In addition, a second insulating layer 1106 made of SiO$_2$ is laminated so as to cover the first insulating layer 1105. When a metal having a higher density than that of Al is used for the IDT 1103, the absolute value of the reflection coefficient can be increased, and undesirable ripples can be suppressed.

In the surface acoustic wave device 1001 described in WO2006/011417A1, as the thickness of the IDT made of Al is increased, the absolute value of the reflection coefficient can be increased. However, the inventors of the present invention discovered that superior resonance characteristics cannot be obtained by only increasing the absolute value of the reflection coefficient. That is, it was found that in the surface acoustic wave device described in WO2006/011417A1, although the absolute value of the reflection coefficient can be increased by increasing the thickness of the electrode made of Al, since the sign of the reflection coefficient is negative, many ripples are generated in a passband, and as a result, superior resonance characteristics cannot be obtained.

In WO2006/011417A1, the relationship between the thickness of the IDT and the reflection coefficient is described only with respect to the case in which the IDT made of Al is provided on the LiTaO$_3$ substrate. In addition, paragraph [0129] of WO2006/011417A1 discloses that another metal, such as Au, may also be used to form the IDT. However, this description only discloses that when a LiNbO$_3$ substrate is used, another metal, such as Au, may be used. That is, WO2006/011417A1 does not disclose that when a LiTaO$_3$ substrate is used, the IDT may be formed using a metal other than Al.

On the other hand, Japanese Unexamined Patent Application Publication No. 2004-112748 discloses as described above that when the IDT made of a metal having a higher density than that of Al is used, the absolute value of the reflection coefficient can be increased. However, Japanese Unexamined Patent Application Publication No. 2004-112748 only discloses that ripples can be suppressed by increasing the absolute value of the reflection coefficient, and the sign of the reflection coefficient has not been considered. In addition, in the surface acoustic wave device described in Japanese Unexamined Patent Application Publication No. 2004-112748, there has been a problem of a low electromechanical coupling coefficient $k^2$.

SUMMARY OF THE INVENTION

To overcome the problems described above, preferred embodiments of the present invention provide a surface acoustic wave device in which a LiTaO$_3$ substrate is used as a piezoelectric substrate, the reflection coefficient of an IDT is not only high, but the sign thereof is positive, the electromechanical coupling coefficient $k^2$ is also high, and superior resonance characteristics and/or filter characteristics can be obtained.

According to a preferred embodiment of the present invention, a surface acoustic wave device includes a piezoelectric substrate composed of LiTaO$_3$ and including a plurality of grooves provided in the upper surface thereof, and an IDT including a plurality of electrode fingers which are defined by a metal filled in the plurality of grooves in the upper surface of the piezoelectric substrate, wherein when the density of the metal is represented by $\rho$ (kg/m$^2$), and the stiffness thereof is represented by $C_{44}$ (N/m$^2$), the metal satisfies the following equation (1).

$$(\rho^3 \times C_{44})^{1/2} > 1.95 \times 10^{11} \qquad \text{Equation (1)}$$

As the above metal material, at least one metal selected from the group consisting of Mo, Ta, Au, Pt, and W or an alloy primarily containing the above metal, for example, may preferably be used. In this case, the reflection coefficient of the IDT has a positive value with certainly, the absolute value thereof is sufficiently increased, and a high electromechanical coupling coefficient $k^2$ is achieved.

The metal defining the IDT is not necessarily a single metal. According to a preferred embodiment of the present invention, the IDT may preferably be composed of a laminated metal film including metal films laminated to each other, and each of the metal films is composed of a metal selected from the group consisting of Al, Au, Ta, W, Pt, Cu, Ni, and Mo, for example. In this case, the above equation (1) is preferably satisfied when the quotient obtained by dividing the sum of the products of thicknesses T of the metal films and the densities of the metals forming the metal films by the sum of the thicknesses T of the metal films is defined as an average density and is represented by the above ρ (kg/m³), and when an average stiffness, which is the quotient obtained by dividing the sum of the products of the thicknesses T of the metal films and the stiffnesses of the metals forming the metal films by the sum of the thicknesses T of the metal films, and the metal films defining the laminated metal film, is represented by the above $C_{44}$ (N/m²).

In addition, the surface acoustic wave device according to a preferred embodiment of the present invention preferably further includes a dielectric film which includes $SiO_2$ or an inorganic material primarily composed of $SiO_2$ and which covers the IDT and the piezoelectric substrate. Since the temperature coefficient of frequency of the dielectric film including $SiO_2$ or an inorganic material primarily composed of $SiO_2$ has a positive value, and the temperature coefficient of frequency of $LiTaO_3$ has a negative value, a surface acoustic wave device having a small absolute value of the temperature coefficient of frequency TCF is provided.

In the surface acoustic wave device according to a preferred embodiment of the present invention, when the wavelength of a surface acoustic wave is represented by λ, a normalized thickness of the dielectric film which is normalized by λ is preferably set to about 0.05 to about 0.3, for example. With this configuration, a positive and a higher reflection coefficient and a high electromechanical coupling coefficient k² are obtained.

In addition, the cut angle of the $LiTaO_3$ substrate is preferably expressed in Euler angles (0°±10°, 70°~180°, 0°±10°), for example. With this configuration, by using a Rayleigh wave and an SH wave, a surface acoustic wave device having a high and a positive reflection coefficient and further having a high electromechanical coupling coefficient k² is provided.

According to a preferred embodiment of the present invention, in an IDT having a plurality of electrode fingers defined by a metal filled in grooves provided in an upper surface of a $LiTaO_3$ substrate, the metal satisfies the above equation (1). Thus, the absolute value of the reflection coefficient of the IDT is not only high, but also the reflection coefficient has a positive value, and a high electromechanical coupling coefficient k² can be obtained. Accordingly, in the resonance characteristics and/or filter characteristics of the surface acoustic wave device, ripples are effectively suppressed and prevented from being generated in a passband, so that superior frequency characteristics can be obtained.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 4 is a view showing the impedance-phase characteristics and the frequency-phase characteristics according to the preferred embodiment shown in FIGS. 1A and 1B in which the reflection coefficient of the IDT is about 0.09.

FIG. 5 is a view showing the impedance-frequency characteristics and the phase-frequency characteristics of a surface acoustic wave device prepared for comparison purpose in which the reflection coefficient γ of an IDT is about −0.09.

FIG. 8 is a view showing the relationship between the normalized thickness H/λ of an IDT and the electromechanical coupling coefficient k² of each of surface acoustic wave devices in which the normalized thicknesses of $SiO_2$ films are each about 0.3, and IDTs made of various metals are each provided on upper surface of a $LiTaO_3$ substrate having Euler angles (0°, 126°, 0°).

FIG. 9 is a view showing the relationship between the normalized thickness H/λ of an IDT and the electromechanical coupling coefficient k² of each of surface acoustic wave devices in which the normalized thicknesses of $SiO_2$ films are each about 0.05, and IDTs are defined by filling various metals in upper surface grooves of $LiTaO_3$ substrates each having Euler angles (0°, 126°, 0°).

DETAILED DESCRIPTION OF THE PREFERRED EMBODIMENTS

Hereinafter, preferred embodiments of the present invention will be described with reference to the drawings so as to disclose the present invention.

Figure 1A:
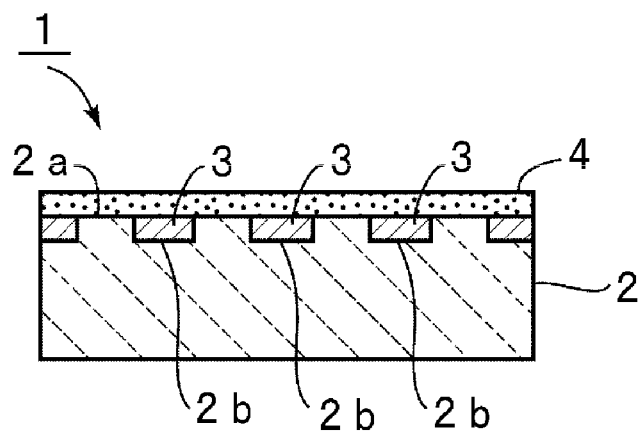
FIG. 1A is a partially schematic front cross-sectional view showing a portion of a surface acoustic wave device according to a preferred embodiment of the present invention.
Figure 1B:
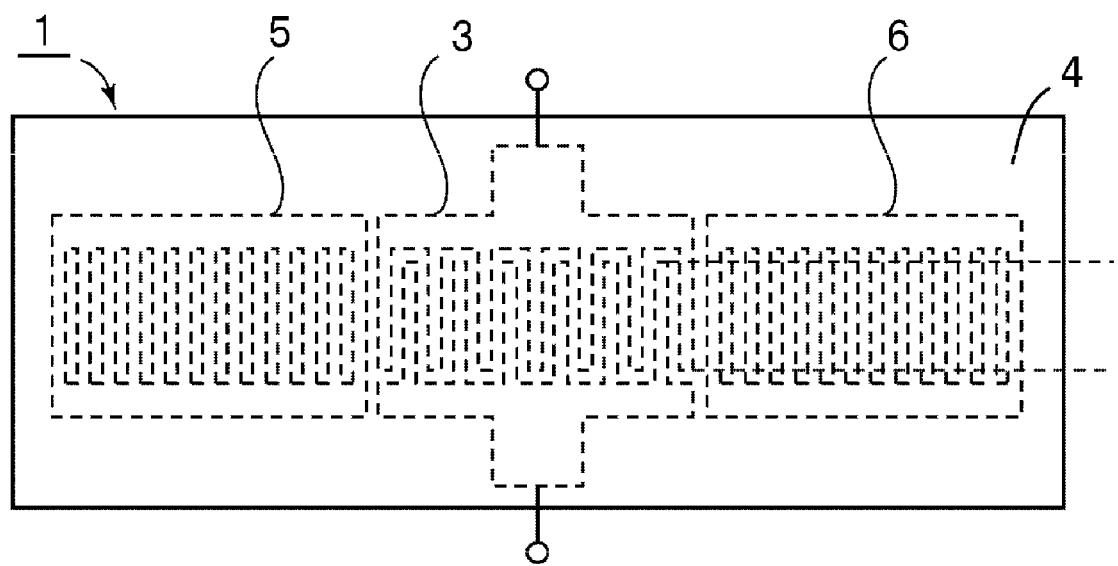
FIG. 1B is a schematic plan view of the surface acoustic wave device.

FIG. 1A is a partial schematic front cross-sectional view showing a portion at which an IDT of a surface acoustic wave device according to a first preferred embodiment of the present invention is provided, and FIG. 1B is a schematic plan view of the surface acoustic wave device.

As shown in FIG. 1A, a surface acoustic wave device 1 includes a LiTaO₃ substrate 2. In an upper surface 2a of the LiTaO₃ substrate 2, a plurality of grooves 2b is provided. By filling a metal in the plurality of grooves 2b, an IDT 3 having a plurality of electrode fingers is formed. An upper surface of the IDT 3 and the upper surface 2a of the LiTaO₃ substrate 2 are flush or substantially flush with one another.

A SiO₂ film 4 is arranged so as to cover the upper surface 2a and the IDT 3.

As shown in FIG. 1B, the surface acoustic wave device 1 preferably is a one-port type surface acoustic wave resonator which includes the IDT 3 and first and second reflectors 5 and 6 disposed at both sides of the IDT 3 in a surface acoustic wave propagation direction. In addition, the reflectors 5 and 6 are preferably grating reflectors in which two ends of the electrode fingers are short-circuited.

As in the case of the IDT 3, the reflectors 5 and 6 are each formed such that the same metal as that used for the IDT is filled in grooves provided in the upper surface 2a of the LiTaO$_3$ substrate 2. Thus, in the reflectors 5 and 6, the electrode surface and the upper surface 2a of the LiTaO$_3$ substrate 2 are flush or substantially flush with one another. Accordingly, the upper surface of the SiO$_2$ film 4 is substantially planarized over the entire surface acoustic wave device 1.

Although the temperature coefficient of frequency TCF of the LiTaO$_3$ substrate 2 has a negative value, the temperature coefficient of frequency TCF of the SiO$_2$ film 4 has a positive value, and thus, the absolute value of the temperature coefficient of frequency TCF is decreased overall. As a result, in the surface acoustic wave device 1, changes in frequency characteristics with changes in temperature are very small.

In the present preferred embodiment, the following equation (1) is preferably satisfied when the density of a metal forming the IDT is represented by ρ (kg/m$^3$), and the stiffness is represented by $C_{44}$ (N/m$^2$):

$$(\rho^3 \times C_{44})^{1/2} > 1.95 \times 10^{11} \qquad \text{Equation (1)}$$

As a result, in the surface acoustic wave device 1 according to the present preferred embodiment, the absolute value of the reflection coefficient of the IDT 3 is not only increased, but also the reflection coefficient has a positive value, and a high electromechanical coupling coefficient k$^2$ can be obtained, such that superior resonance characteristics having small ripples can be obtained.

In surface acoustic wave devices, although it has been understood that the absolute value of the reflection coefficient of an IDT is preferably increased, attention has not been paid to the polarity of the reflection coefficient. However, the inventors of the present invention discovered that when the polarity of the reflection coefficient has a negative value, ripples are generated, and superior resonance characteristics and/or filter characteristics cannot be obtained. Hereinafter, this finding will be described with reference to particular experimental examples.

Figure 2:
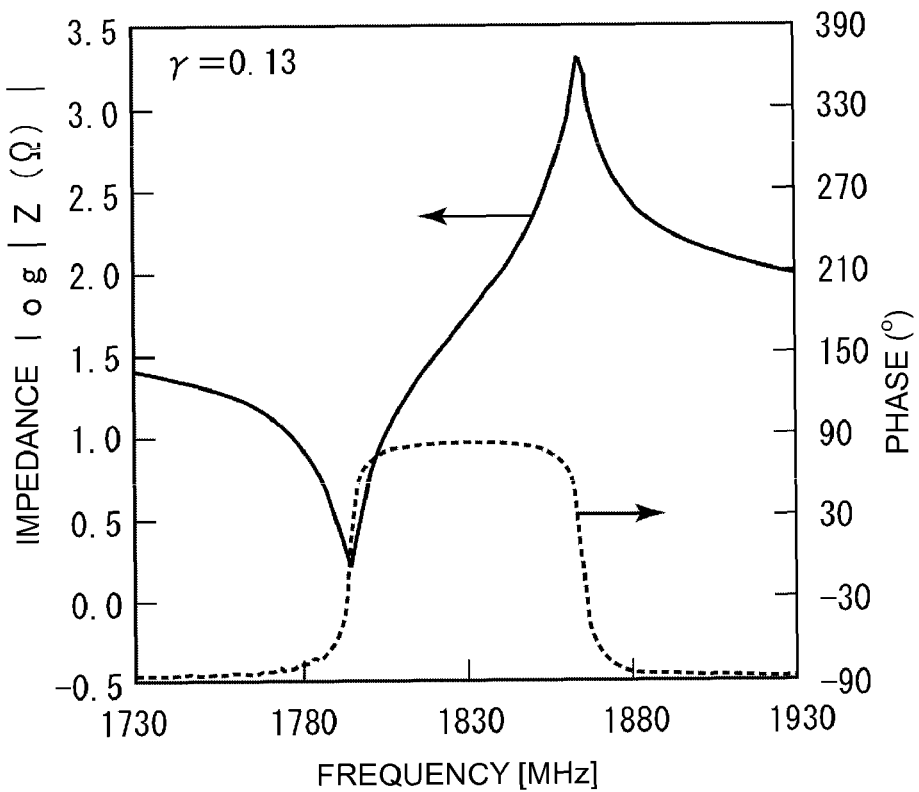
FIG. 2 is a view showing impedance-phase characteristics and frequency-phase characteristics according to the preferred embodiment shown in FIG. 1 in which the reflection coefficient of an IDT is about 0.13.

FIG. 2 is a view showing impedance-frequency characteristics and phase-frequency characteristics obtained when a reflection coefficient γ of the IDT is set to about 0.13. In this case, the grooves 2b having a depth of about 0.05λ were formed in a LiTaO$_3$ substrate of Euler angles (0°, 126°, 0°) to have a groove width of about 0.5 μm, for example. Gold (Au) was used as an electrode material that is filled in the grooves, so that the IDT 3 was formed in which the number of pairs was 100 and the intersection width was about 30 μm. In addition, the reflectors 5 and 6 were formed so that the width of the electrode finger and the electrode thickness were similar to those of the IDT 3, and the number of electrode fingers of each reflector was set to 100. In the surface acoustic wave device 1, the reflection coefficient of the electrode finger of the IDT was about 0.13.

In addition, for comparison, a surface acoustic wave device was formed in which the metal filled in the grooves of the LiTaO$_3$ substrate was changed to Al, the reflection coefficient λ of the IDT was set to about −0.13, and the reflection coefficient λ of each of the reflectors 5 and 6 was also set to about −0.13. The impedance-frequency characteristics and the phase-frequency characteristics of the surface acoustic wave device of a first comparative example are shown in FIG. 3.

Figure 3:
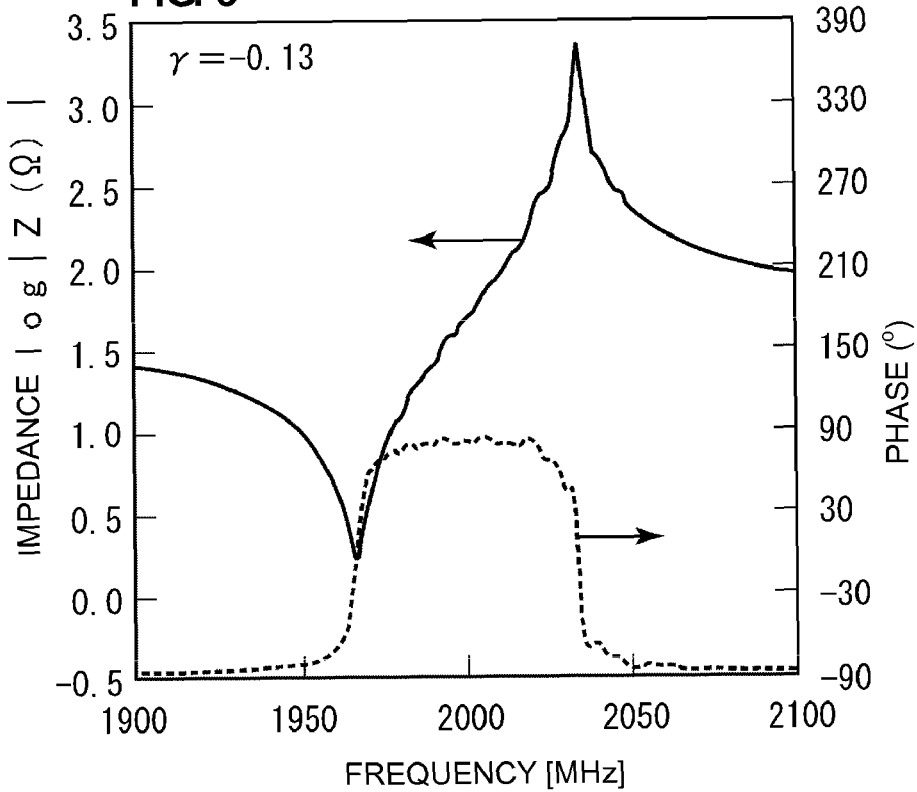
FIG. 3 is a view showing impedance-frequency characteristics and phase-frequency characteristics of a surface acoustic wave device prepared for comparison purpose in which a reflection coefficient γ of an IDT is about −0.13.

As shown by comparing FIG. 2 to FIG. 3, although many ripples are generated in a passband in the surface acoustic wave device of the first comparative example, similar ripples are not generated in the present preferred embodiment, and thus, superior resonance characteristics are obtained.

In addition, a surface acoustic wave device was formed in which the thickness of the Au was changed from about 0.05λ to about 0.3λ, and the reflection coefficient γ was about 0.09, and the impedance-frequency characteristics and the phase-frequency characteristics were measured. The results are shown in FIG. 4.

In addition, for comparison, a surface acoustic wave device was formed as a second comparative example in a manner similar to that described above except that the metal forming the IDT and the reflectors was changed to Al and the reflection coefficient γ was set to about −0.09. The impedance-frequency characteristics and the phase-frequency characteristics of the surface acoustic wave device of the second comparative example are shown in FIG. 5.

As shown in FIG. 5, although many ripples are generated in a passband, according to the present preferred embodiment shown in FIG. 4, the ripples are not generated.

Accordingly, as shown by comparing FIGS. 2 and 3 and by comparing FIGS. 4 and 5, when the polarity of the reflection coefficient of the IDT 3 is negative, a plurality of undesirable ripples is generated in a passband. However, according to the present preferred embodiment in which the reflection coefficient γ has a positive value, a plurality of ripples is not generated, and thus, superior resonance characteristics are obtained.

Figure 6:
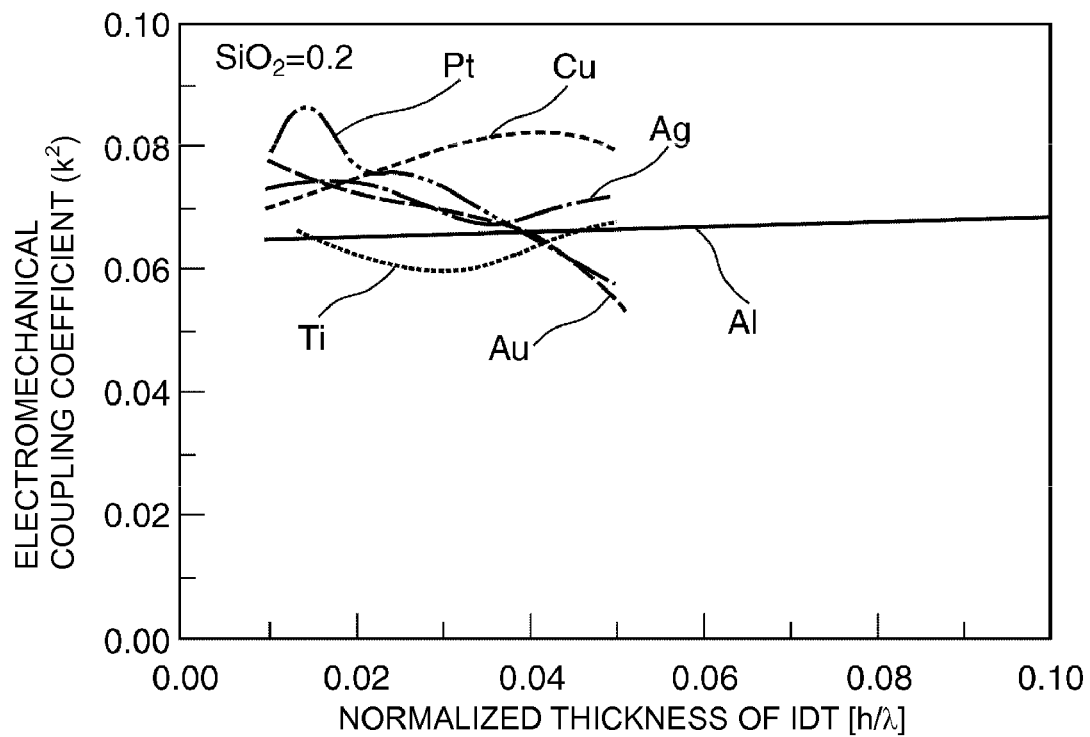
FIG. 6 is a view showing the relationship between a normalized thickness H/λ of an IDT and an electromechanical coupling coefficient k² of each of surface acoustic wave devices in which the normalized thicknesses of $SiO_2$ films are each about 0.2, and IDTs made of various metals are each provided on upper surface of a $LiTaO_3$ substrate having Euler angles (0°, 126°, 0°).
Figure 7:
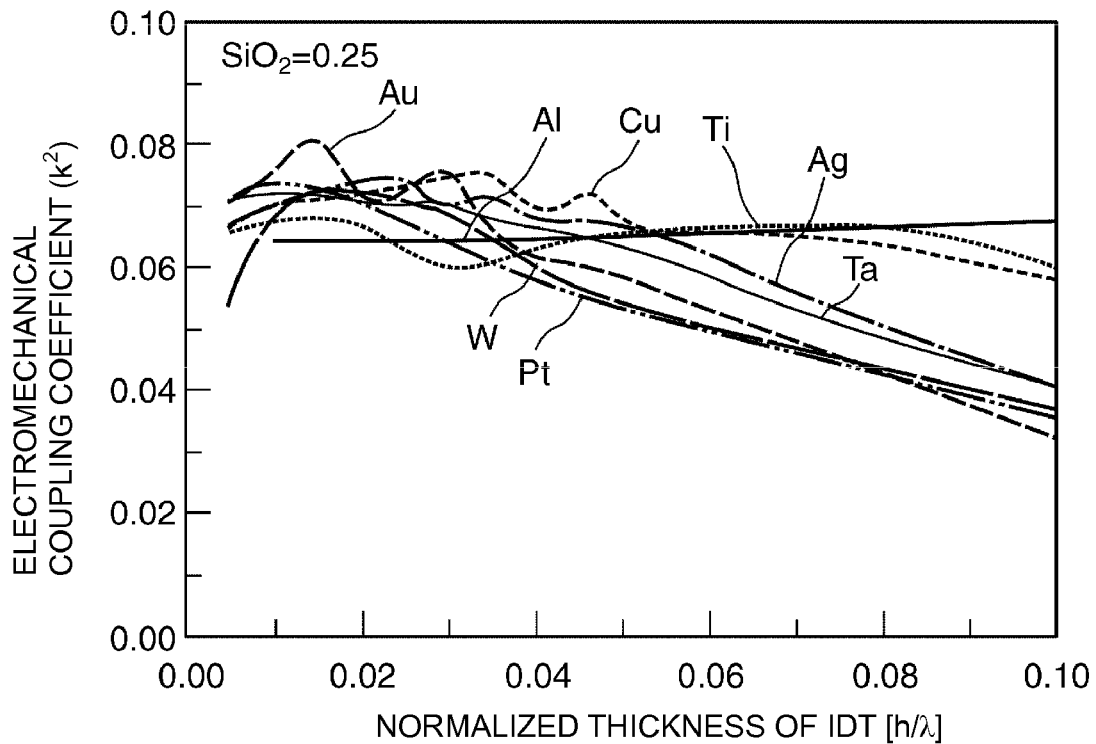
FIG. 7 is a view showing the relationship between the normalized thickness H/λ of an IDT and the electromechanical coupling coefficient k² of each of surface acoustic wave devices in which the normalized thicknesses of $SiO_2$ films are each about 0.25, and IDTs made of various metals are each provided on upper surface of a $LiTaO_3$ substrate having Euler angles (0°, 126°, 0°).
Figure 10:
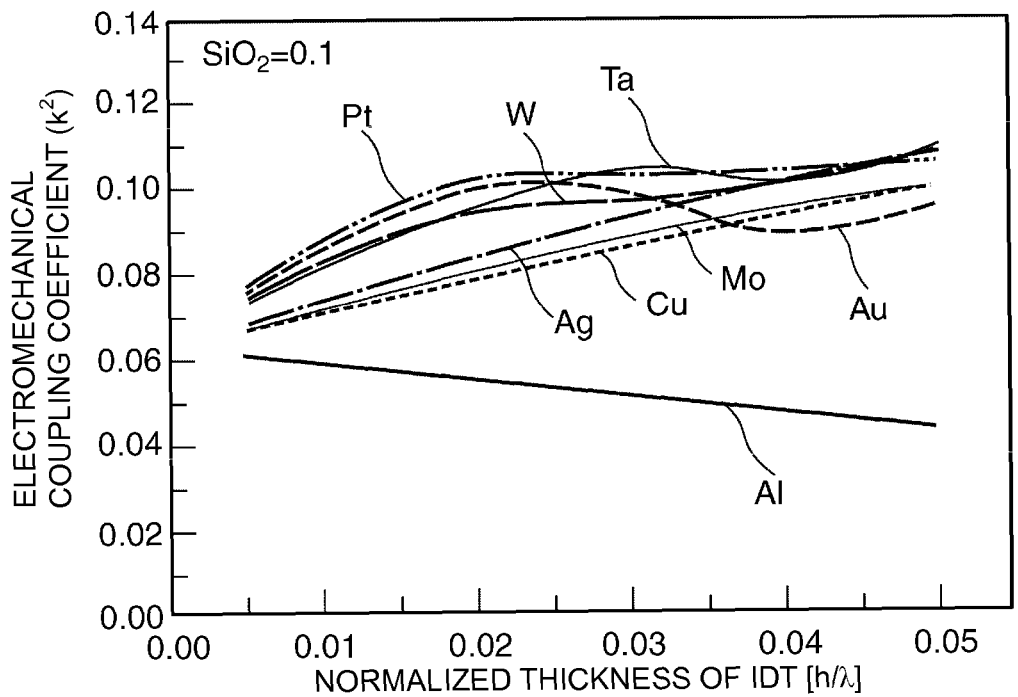
FIG. 10 is a view showing the relationship between the normalized thickness H/λ of an IDT and the electromechanical coupling coefficient k² of each of surface acoustic wave devices in which the normalized thicknesses of $SiO_2$ films are each about 0.1, and IDTs are defined by filling various metals in grooves of $LiTaO_3$ substrates each having Euler angles (0°, 126°, 0°).
Figure 11:
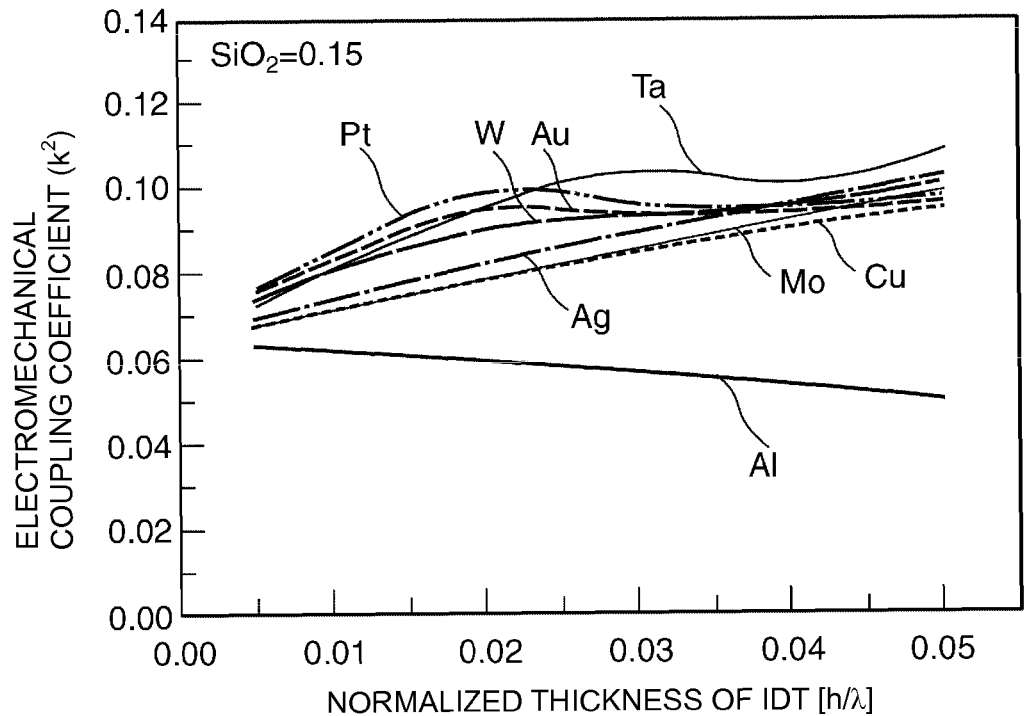
FIG. 11 is a view showing the relationship between the normalized thickness H/λ of an IDT and the electromechanical coupling coefficient k² of each of surface acoustic wave devices in which the normalized thicknesses of $SiO_2$ films are each about 0.15, and IDTs are defined by filling various metals in upper surface grooves of $LiTaO_3$ substrates each having Euler angles (0°, 126°, 0°).
Figure 12:
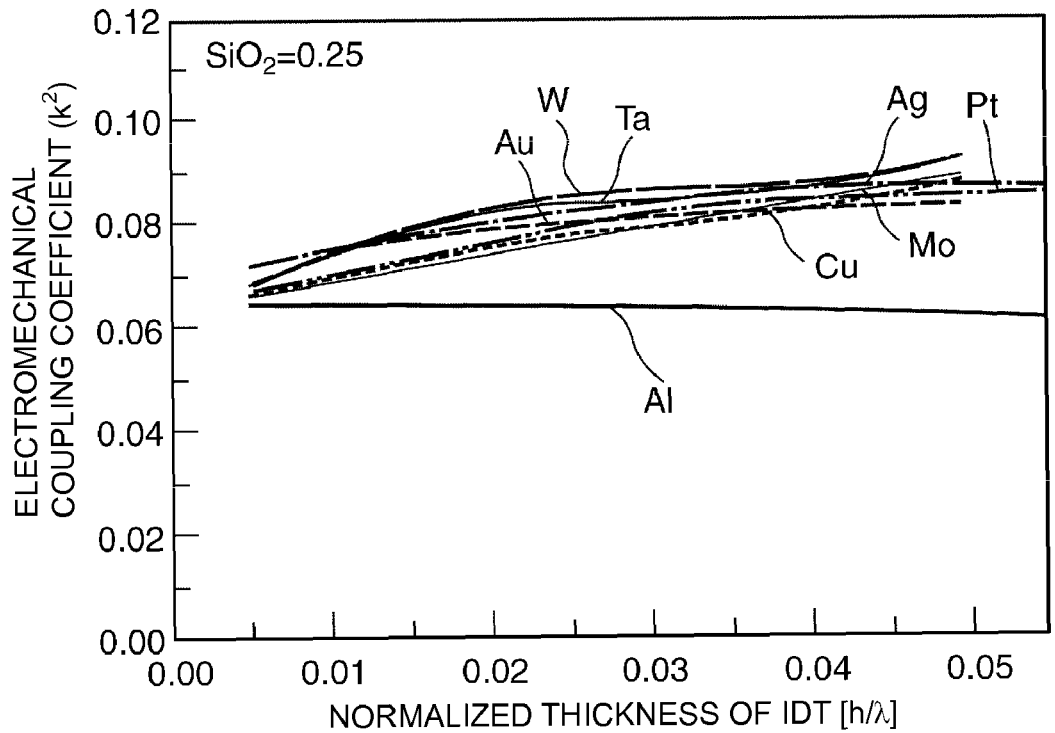
FIG. 12 is a view showing the relationship between the normalized thickness H/λ of an IDT and the electromechanical coupling coefficient k² of each of surface acoustic wave devices in which the normalized thicknesses of $SiO_2$ films are each about 0.25, and IDTs are defined by filling various metals in upper surface grooves of $LiTaO_3$ substrates each having Euler angles (0°, 126°, 0°).
Figure 13:
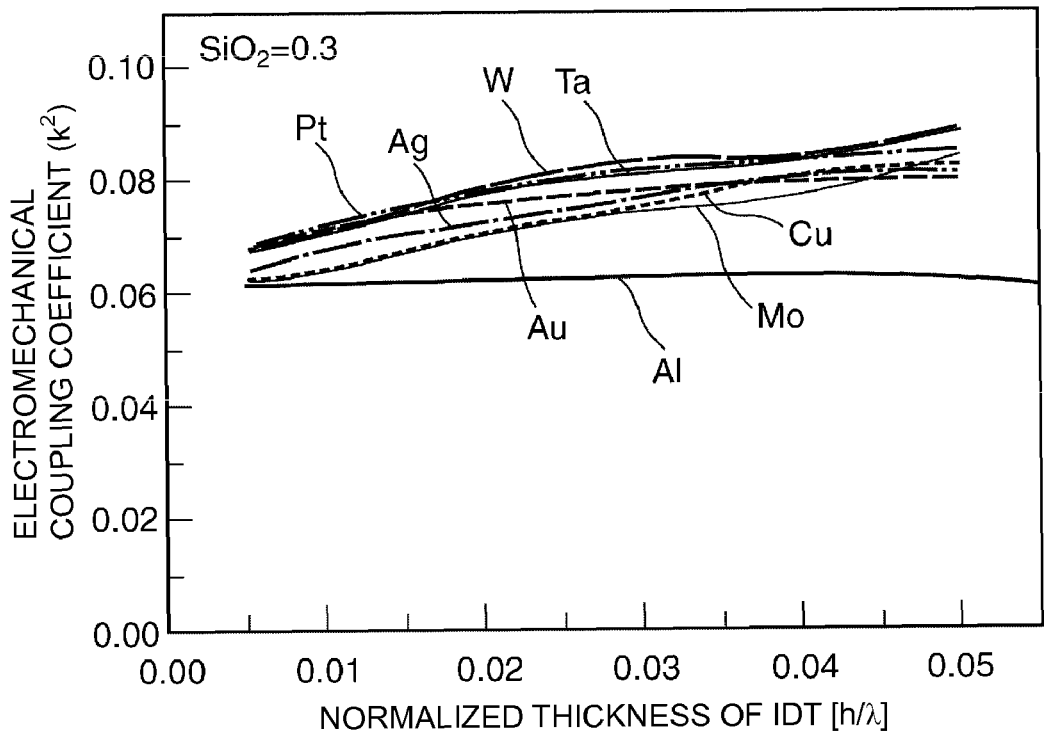
FIG. 13 is a view showing the relationship between the normalized thickness H/λ of an IDT and the electromechanical coupling coefficient k² of each of surface acoustic wave devices in which the normalized thicknesses of $SiO_2$ films are each about 0.3, and IDTs are defined by filling various metals in upper surface grooves of $LiTaO_3$ substrates each having Euler angles (0°, 126°, 0°).
Figure 14:
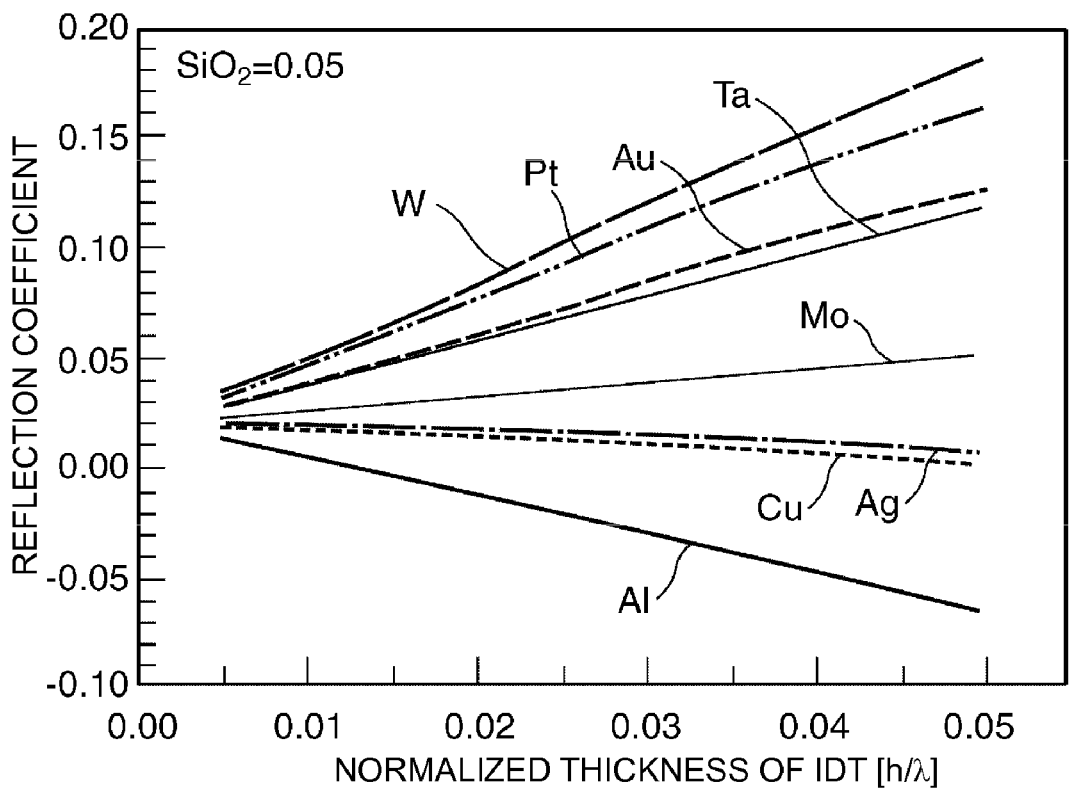
FIG. 14 is a view showing the relationship between the normalized thickness H/λ of an IDT and the reflection coefficient in each of surface acoustic wave devices in which the normalized thicknesses of SiO₂ films are each about 0.05, and IDTs are defined by filling various metals in upper surface grooves of LiTaO₃ substrates.
Figure 15:
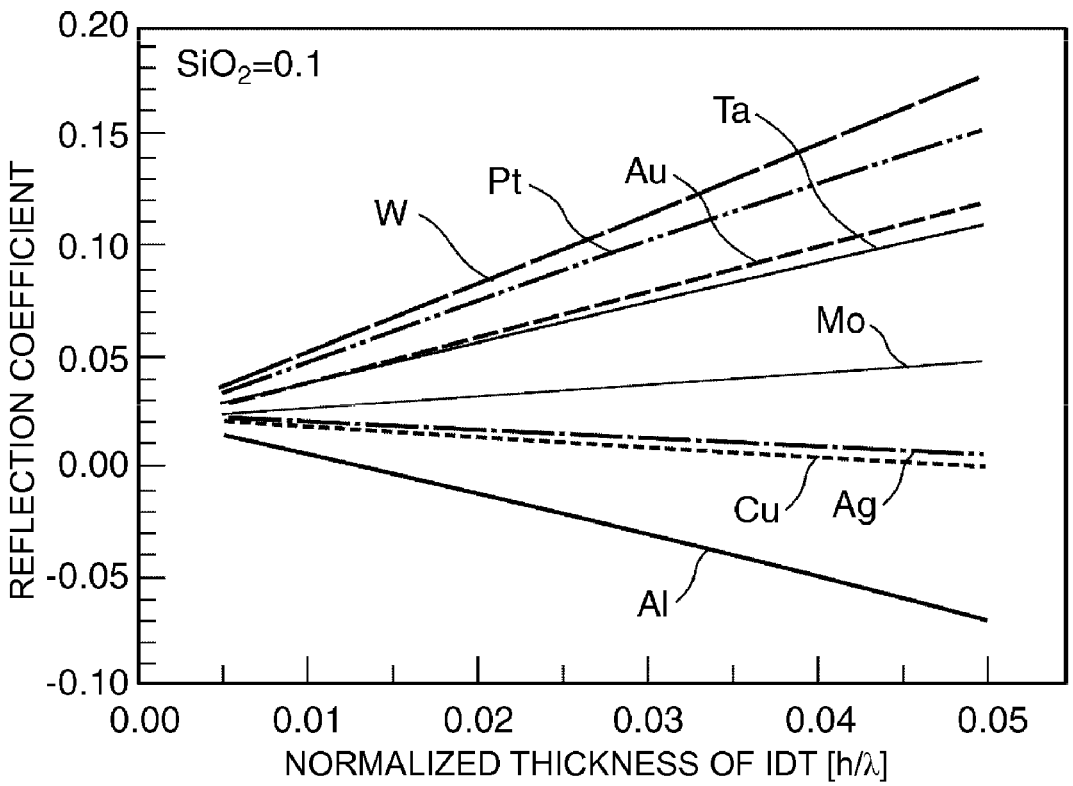
FIG. 15 is a view showing the relationship between the normalized thickness H/λ of an IDT and the reflection coefficient in each of surface acoustic wave devices in which the normalized thicknesses of SiO₂ films are each about 0.1, and IDTs are defined by filling various metals in upper surface grooves of LiTaO₃ substrates each having Euler angles (0°, 126°, 0°).
Figure 16:
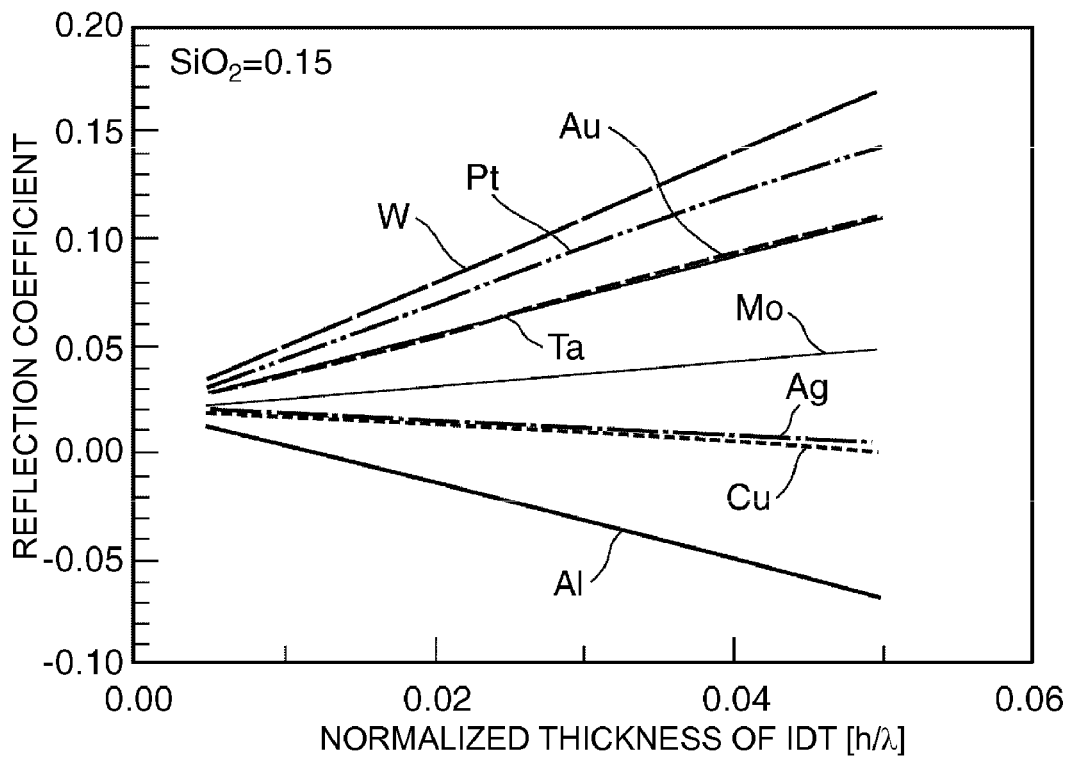
FIG. 16 is a view showing the relationship between the normalized thickness H/λ of an IDT and the reflection coefficient in each of surface acoustic wave devices in which the normalized thicknesses of SiO₂ films are each about 0.15, and IDTs are defined by filling various metals in upper surface grooves of LiTaO₃ substrates each having Euler angles (0°, 126°, 0°).
Figure 17:
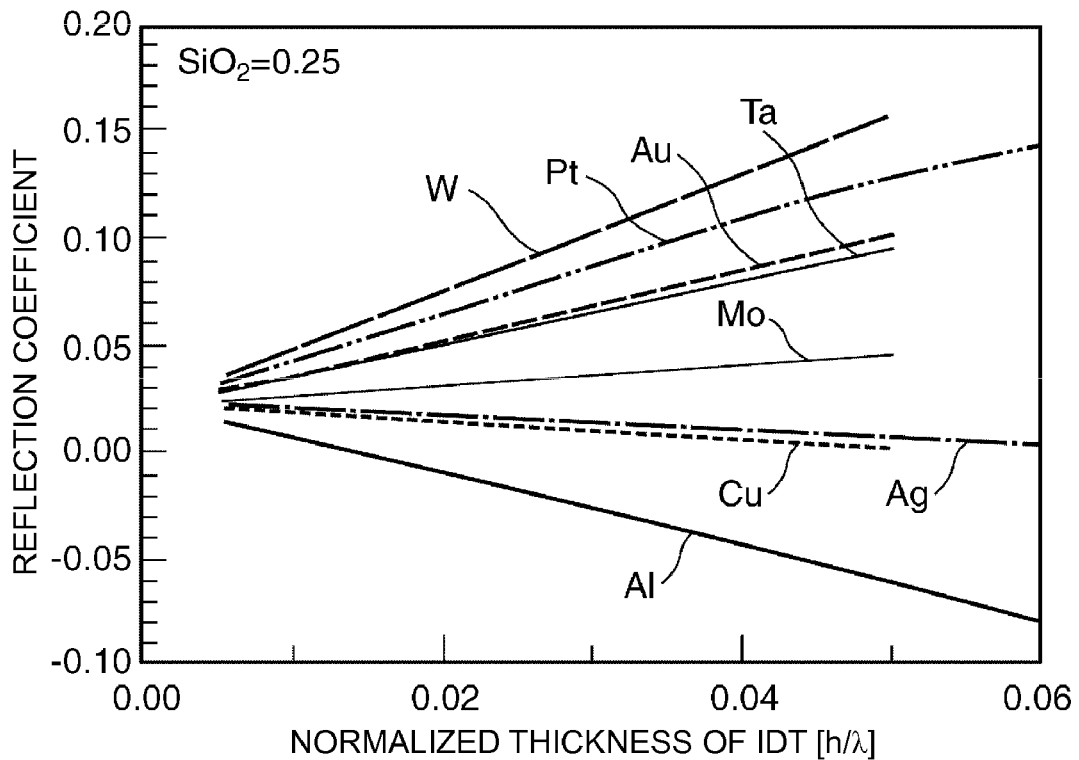
FIG. 17 is a view showing the relationship between the normalized thickness H/λ of an IDT and the reflection coefficient in each of surface acoustic wave devices in which the normalized thicknesses of SiO₂ films are each about 0.25, and IDTs are defined by filling various metals in upper surface grooves of LiTaO₃ substrates each having Euler angles (0°, 126°, 0°).
Figure 18:
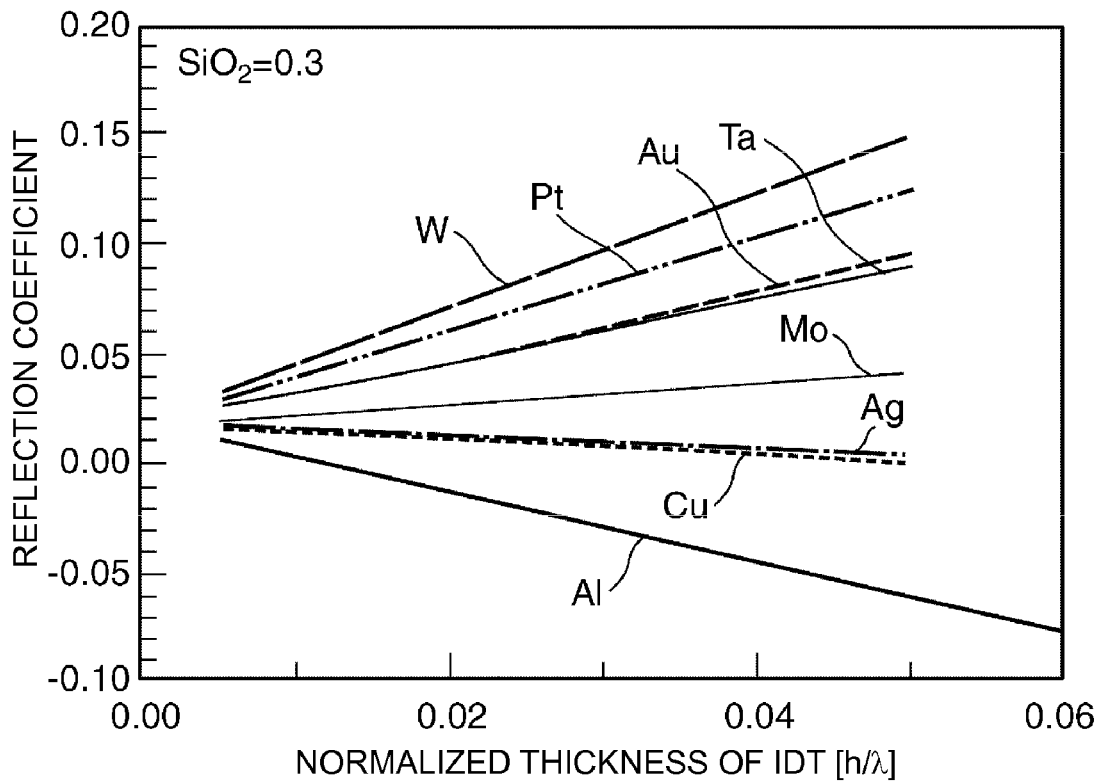
FIG. 18 is a view showing the relationship between the normalized thickness H/λ of an IDT and the reflection coefficient in each of surface acoustic wave devices in which the normalized thicknesses of SiO₂ films are each about 0.3, and IDTs are defined by filling various metals in upper surface grooves of LiTaO₃ substrates each having Euler angles (0°, 126°, 0°).
Figure 31:
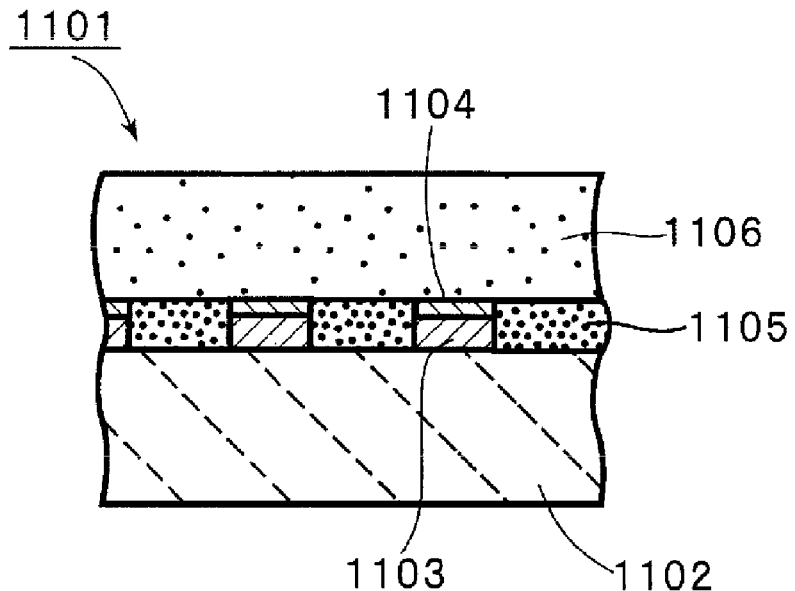
FIG. 31 is a partially cut-off front cross-sectional view showing another example of a conventional surface acoustic wave device.

In addition, FIGS. 6 to 8 are views showing the relationship between the normalized thickness of an IDT and an electromechanical coupling coefficient k$^2$ of a surface acoustic wave device of a third comparative example in which as in the conventional surface acoustic wave device 1101 shown in FIG. 31, an IDT made of a metal is provided on an upper surface of the LiTaO$_3$ substrate 1002, and a SiO$_2$ film having a flat upper surface is arranged so as to cover the IDT. In this case, the Euler angles of LiTaO$_3$ are (0°, 126°, 0°). In addition, the normalized thickness is a value obtained by dividing the thickness by a wavelength λ of a surface acoustic wave. FIG. 6 shows the results obtained when the normalized thickness of the SiO$_2$ film is about 0.2, FIG. 7 shows the results obtained when the normalized thickness of the SiO$_2$ film is about 0.25, and FIG. 8 shows the results obtained when the normalized thickness of the SiO$_2$ film is about 0.3.

In addition, FIGS. 9 to 13 are views showing the relationship between the normalized thickness of an IDT and the electromechanical coupling coefficient k$^2$ of a surface acoustic wave device having the structure in which, as in FIG. 1A, the IDT is formed by filling a metal in a plurality of grooves provided in an upper surface of a LiTaO$_3$ substrate, and a SiO$_2$ film is laminated on the LiTaO$_3$ substrate. In this case, the Euler angles of the LiTaO$_3$ substrate are (0°, 126°, 0°). FIGS. 9 to 13 show the results of the cases in which the normalized thicknesses of SiO$_2$ are about 0.05, about 0.1, about 0.15, about 0.25, and about 0.3, respectively.

As is clear from a comparison of the results shown in FIGS. 6 to 8 and those shown in FIGS. 9 to 13, when the metal is filled in the plurality of grooves provided in the upper surface of the LiTaO$_3$ substrate, that is, in the cases shown in FIGS. 9 to 13, the electromechanical coupling coefficient k$^2$ is increased. In particular, as shown in FIGS. 9 to 13 which are obtained when the IDT is formed by filling the metal in the grooves provided in the upper surface of the LiTaO$_3$ substrate, even if the thickness of the SiO$_2$ film is increased, a decrease in electromechanical coupling coefficient k$^2$ is small.

Accordingly, in order to obtain a higher electromechanical coupling coefficient k$^2$, an IDT which includes a plurality of electrode fingers that are formed by filling a metal material in a plurality of grooves provided in a LiTaO$_3$ substrate is preferable.

In addition, FIGS. 14 to 18 are views showing the relationship between a normalized thickness H/λ of an IDT and the reflection coefficient in surface acoustic wave devices in which, as in FIGS. 9 to 13, IDTs are provided which have a plurality of finger electrodes formed by filling various metals in grooves provided in upper surfaces of LiTaO₃ substrates having Euler angles (0°, 126°, 0°), and SiO₂ films having various normalized thicknesses are laminated on the upper surfaces. FIGS. 14 to 18 show the results of the cases in which the normalized thicknesses of the SiO₂ films are about 0.05, about 0.1, about 0.15, about 0.25, and about 0.3, respectively.

As shown in FIGS. 14 to 18, when Al is used for the IDT, and when Ag or Cu is used for the IDT, the reflection coefficient tends to have a negative value, and that even if it has a positive value, the absolute value thereof is relatively small. Furthermore, when the normalized thickness of the IDT is increased, and Al, Ag, or Cu is used for the IDT, the reflection coefficient is shifted from a positive value side to a negative value side.

On the other hand, when a metal which is heavier than Ag is used, regardless of the thickness of the SiO₂ film and the thickness of the IDT, the reflection coefficient has a positive value, and in addition, as the normalized thickness of the IDT is increased, the absolute value of the reflection coefficient can be increased.

Thus, from the results shown in FIGS. 14 to 18, a metal selected from the group consisting of Mo, Ta, Au, Pt, and W, for example, which are each heavier than Ag, is preferably used. That is, when at least one metal selected from the group consisting of the metals mentioned above or an alloy primarily composed of the metals mentioned above is used, the reflection coefficient has a positive value, and in addition, the absolute value of the reflection coefficient can be increased by increasing the normalized thickness of the IDT.

Figure 19:
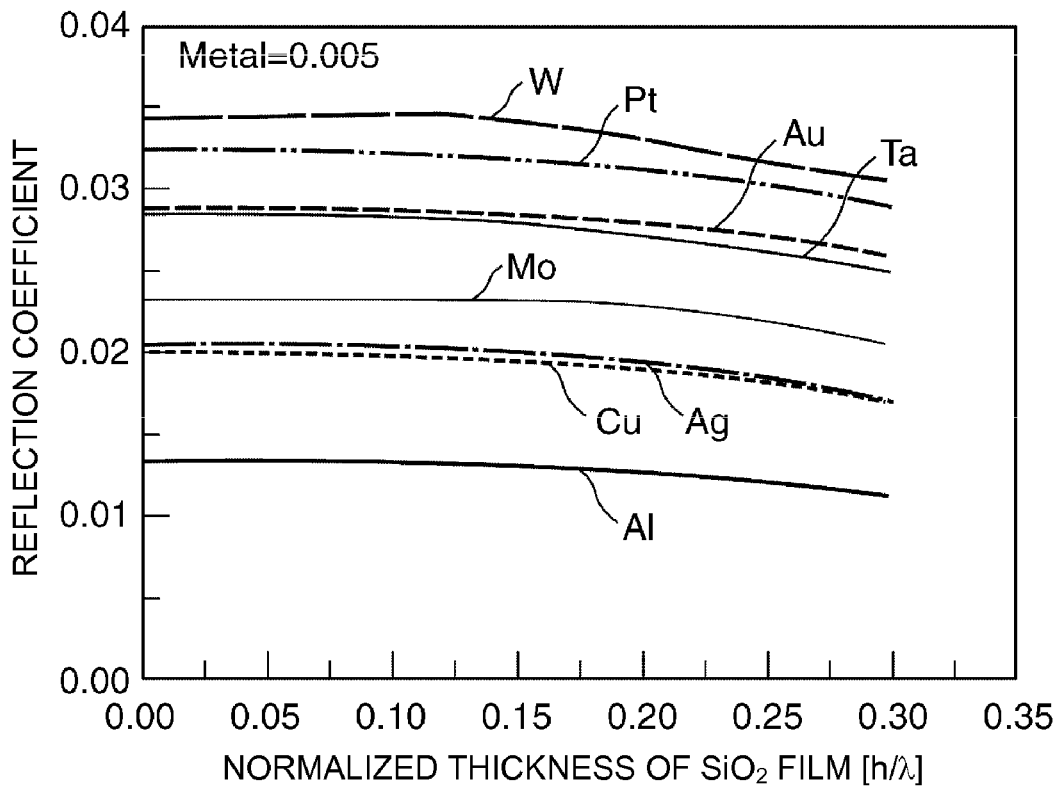
FIG. 19 is a view showing the relationship between the normalized thickness of a SiO₂ film and the reflection coefficient in each of surface acoustic wave devices in which IDTs formed to have a normalized thickness of about 0.005 by filling various metals in upper surface grooves of LiTaO₃ substrates each having Euler angles (0°, 126°, 0°).
Figure 20:
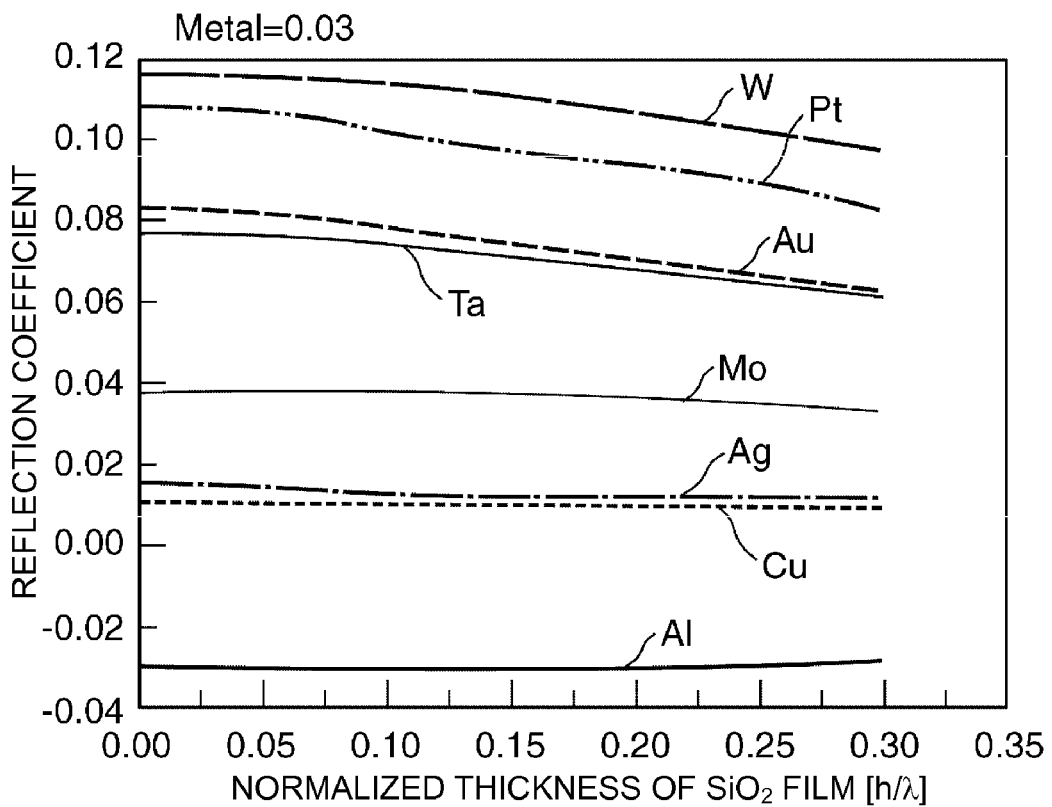
FIG. 20 is a view showing the relationship between the normalized thickness of a SiO₂ film and the reflection coefficient in each of surface acoustic wave devices in which IDTs are formed to have a normalized thickness of about 0.03 by filling various metals in upper surface grooves of LiTaO₃ substrates each having Euler angles (0°, 126°, 0°).
Figure 21:
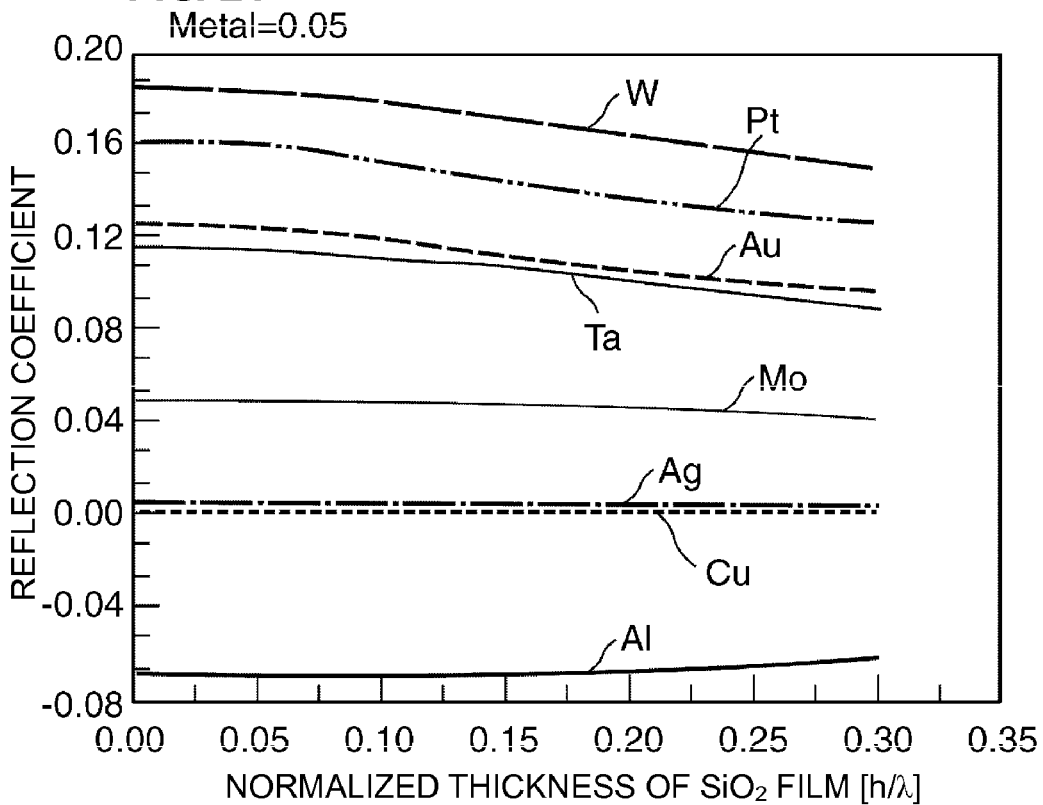
FIG. 21 is a view showing the relationship between the normalized thickness of a SiO₂ film and the reflection coefficient in each of surface acoustic wave devices in which IDTs are formed to have a normalized thickness of about 0.05 by filling various metals in upper surface grooves of LiTaO₃ substrates each having Euler angles (0°, 126°, 0°).

In addition, FIGS. 19 to 21 are views showing the relationship between the normalized thickness of a SiO₂ film and the reflection coefficient in configurations in which IDTs are formed by filling various metals in grooves provided in upper surfaces of LiTaO₃ substrates each having Euler angles (0°, 126°, 0°) and SiO₂ films are further laminated thereon. FIGS. 19 to 21 show the results obtained when the normalized thicknesses of the IDTs are about 0.005, about 0.03, and about 0.05, respectively.

As shown in FIGS. 19 to 21, in each case in which the normalized thickness of the IDT is about 0.005, about 0.03, or about 0.05, even if the thickness of the SiO₂ film is changed, as long as Al, Cu, or Ag is used, the reflection coefficient is small when it has a positive value and may have a negative value in some cases. On the other hand, when the metals described above which are heavier than Ag are used, even if the thickness of the SiO₂ film is changed, the reflection coefficient has a positive value, and even if the thickness of the SiO₂ film is increased, the reflection coefficient is not substantially decreased.

Accordingly, as shown in FIGS. 14 to 18 and FIGS. 19 to 21, even if the thickness of the SiO₂ film is changed, when the IDT is made using a metal that is heavier than Ag, the reflection coefficient has a positive value, and a reflection coefficient having a high absolute value is obtained.

Figure 22:
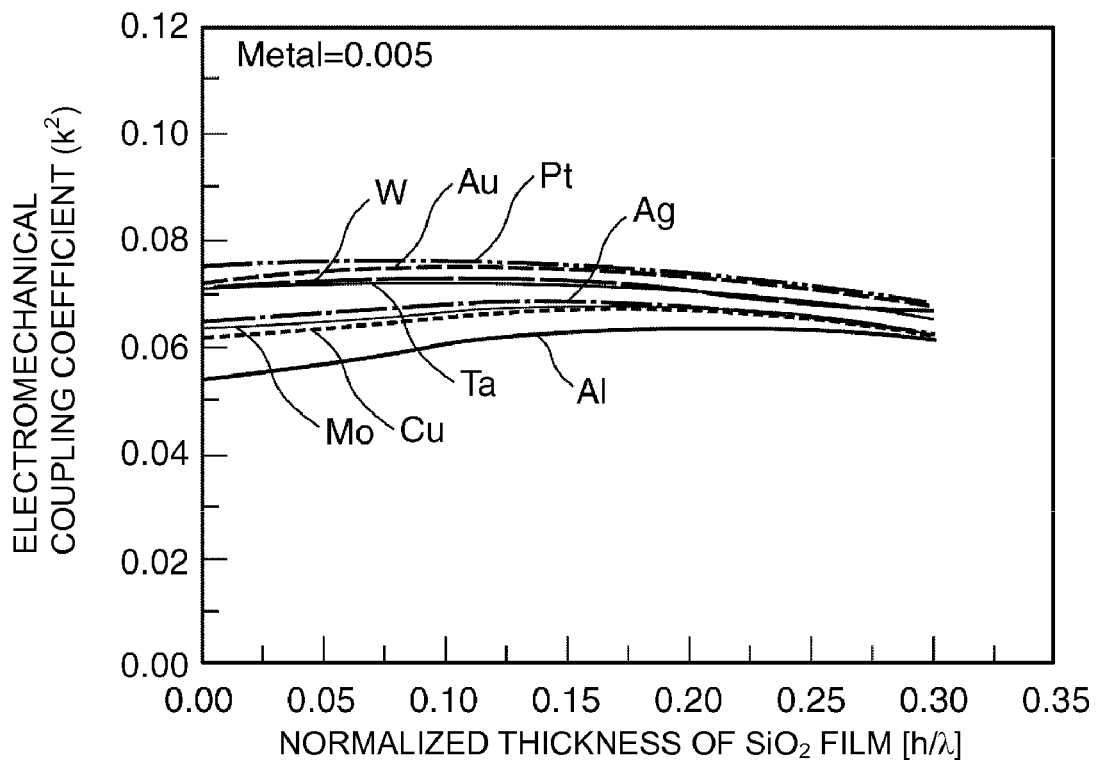
FIG. 22 is a view showing the relationship between the normalized thickness of a SiO₂ film and the electromechanical coupling coefficient $k^2$ of each of surface acoustic wave devices in which IDTs are formed to have a normalized thickness of about 0.005 by filling various metals in upper surface grooves of LiTaO₃ substrates each having Euler angles (0°, 126°, 0°) and in which SiO₂ films are further laminated.
Figure 23:
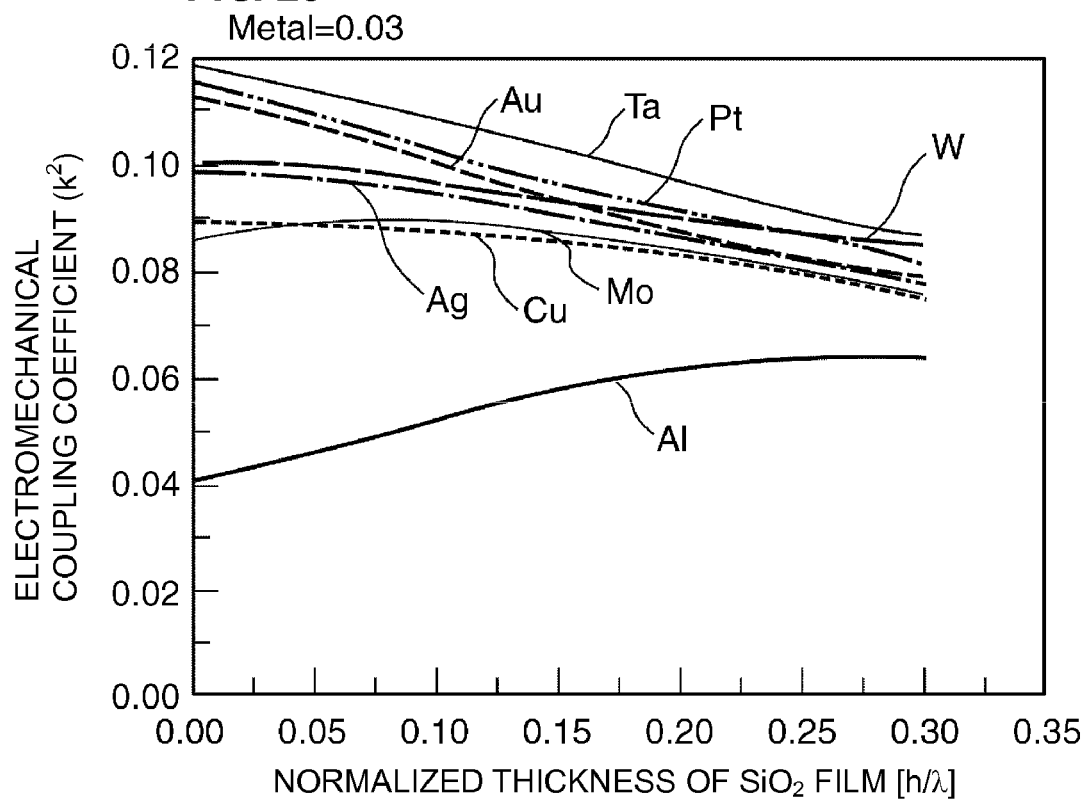
FIG. 23 is a view showing the relationship between the normalized thickness of a SiO₂ film and the electromechanical coupling coefficient $k^2$ of each of surface acoustic wave devices in which IDTs are formed to have a normalized thickness of about 0.03 by filling various metals in upper surface grooves of LiTaO₃ substrates each having Euler angles (0°, 126°, 0°) and in which SiO₂ films are further laminated.
Figure 24:
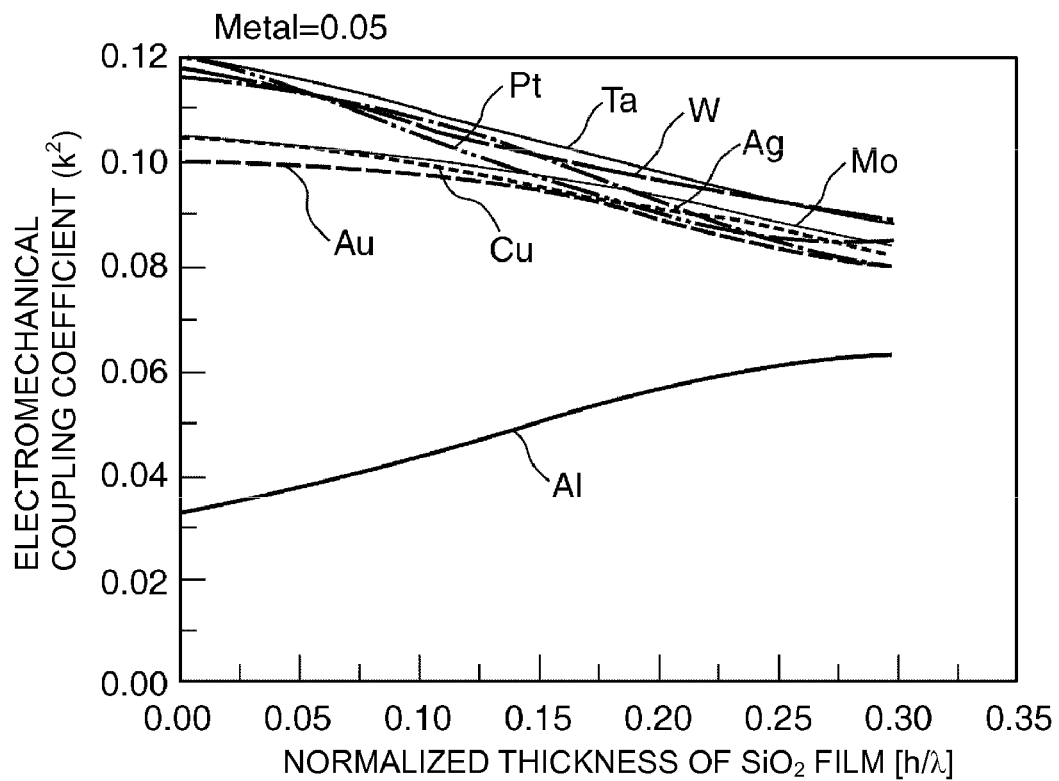
FIG. 24 is a view showing the relationship between the normalized thickness of a SiO₂ film and the electromechanical coupling coefficient $k^2$ of each of surface acoustic wave devices in which IDTs are formed to have a normalized thickness of about 0.05 by filling various metals in upper surface grooves of LiTaO₃ substrates each having Euler angles (0°, 126°, 0°) and in which SiO₂ films are further laminated.

In addition, FIGS. 22 to 24 are views showing the relationship between the normalized thickness of a SiO₂ film and the electromechanical coupling coefficient of the configurations in which IDTs are made by filling various metals in grooves provided in upper surfaces of LiTaO₃ substrates each having Euler angles (0°, 126°, 0°), and SiO₂ films are further laminated thereof. FIGS. 22 to 24 show the results obtained when the normalized thicknesses of the IDTs are about 0.005, about 0.03, and about 0.05, respectively. In the configuration in which a SiO₂ film is provided, the electromechanical coupling coefficient $k^2$ usually tends to decrease due to the lamination of the SiO₂ film. However, in the configuration described above in which the IDT is made using a metal heavier than Ag, as shown in FIGS. 22 to 24, the electromechanical coupling coefficient $k^2$ is not likely to decrease. That is, a sufficiently high electromechanical coupling coefficient $k^2$ can be obtained.

Figure 25:
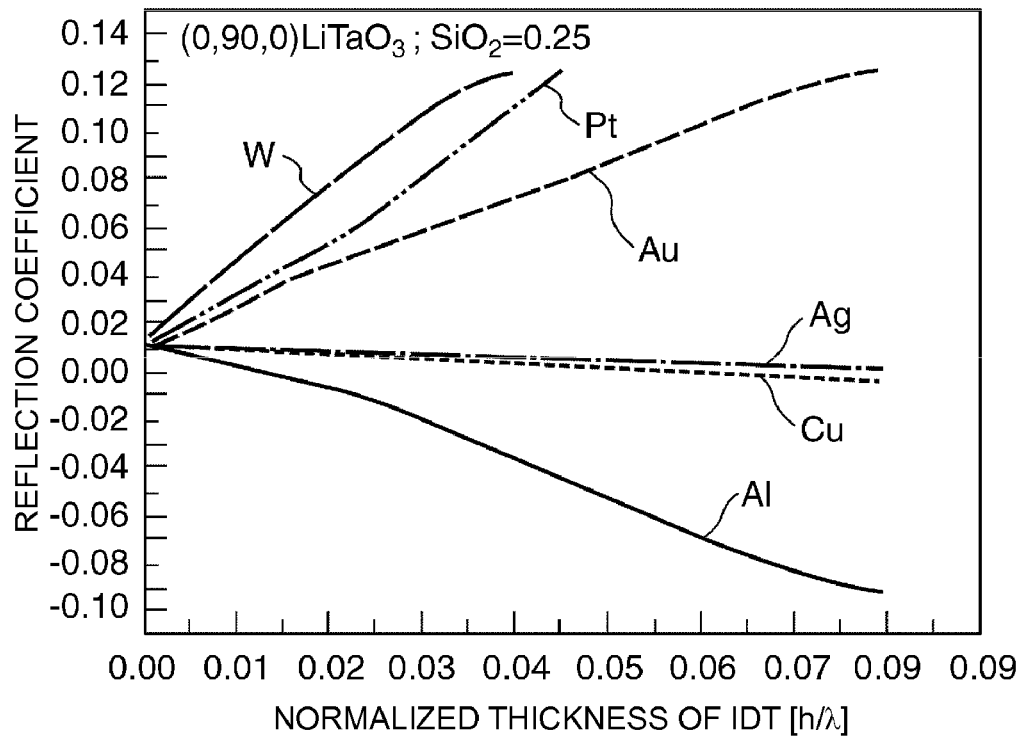
FIG. 25 is a view showing the relationship between the normalized thickness H/λ of an IDT and the reflection coefficient in each of surface acoustic wave devices in which LiTaO₃ substrates each having Euler angles (0°, 90°, 0°) are used, various metals are filled in upper surface grooves of the LiTaO₃ substrates, and SiO₂ films are each further formed to have a normalized thickness of 0.25.

FIG. 25 is a view showing changes in the reflection coefficient with changes in the normalized thickness H/λ of IDTs that are made of various metals of surface acoustic wave devices in which various metals are filled in grooves provided in upper surfaces of LiTaO₃ substrates, and SiO₂ films are further laminated thereon except that the Euler angles are changed to (0°, 90°, 0°). The normalized thickness of the SiO₂ film was set to about 0.25.

As shown in FIG. 25, even if the Euler angles are changed to (0°, 90°, 0°), as in the results shown in FIGS. 6 to 24, when a metal heavier than Ag is used, the reflection coefficient has a positive value, and furthermore, when the normalized thickness H/λ of the IDT is increased, the absolute value of the reflection coefficient is increased.

Accordingly, as in the case in which the Euler angles are (0°, 126°, 0°), when the Euler angles are (0°, 90°, 0°), the same or similar results as those in the preferred embodiments described above can also be obtained.

Figure 26:
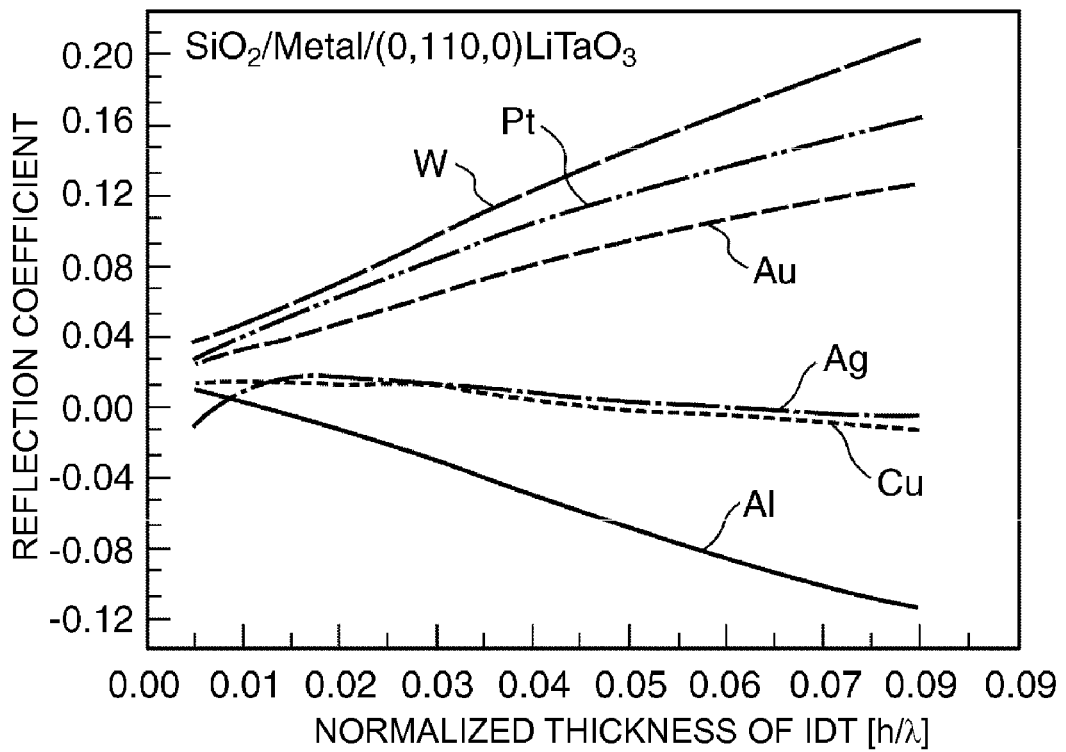
FIG. 26 is a view showing the relationship between the normalized thickness H/λ of an IDT and the reflection coefficient in each of surface acoustic wave devices in which LiTaO₃ substrates each having Euler angles (0°, 110°, 0°) are used, various metals are filled in upper surface grooves of the LiTaO₃ substrates, and SiO₂ films are each further formed to have a normalized thickness of about 0.25.
Figure 27:
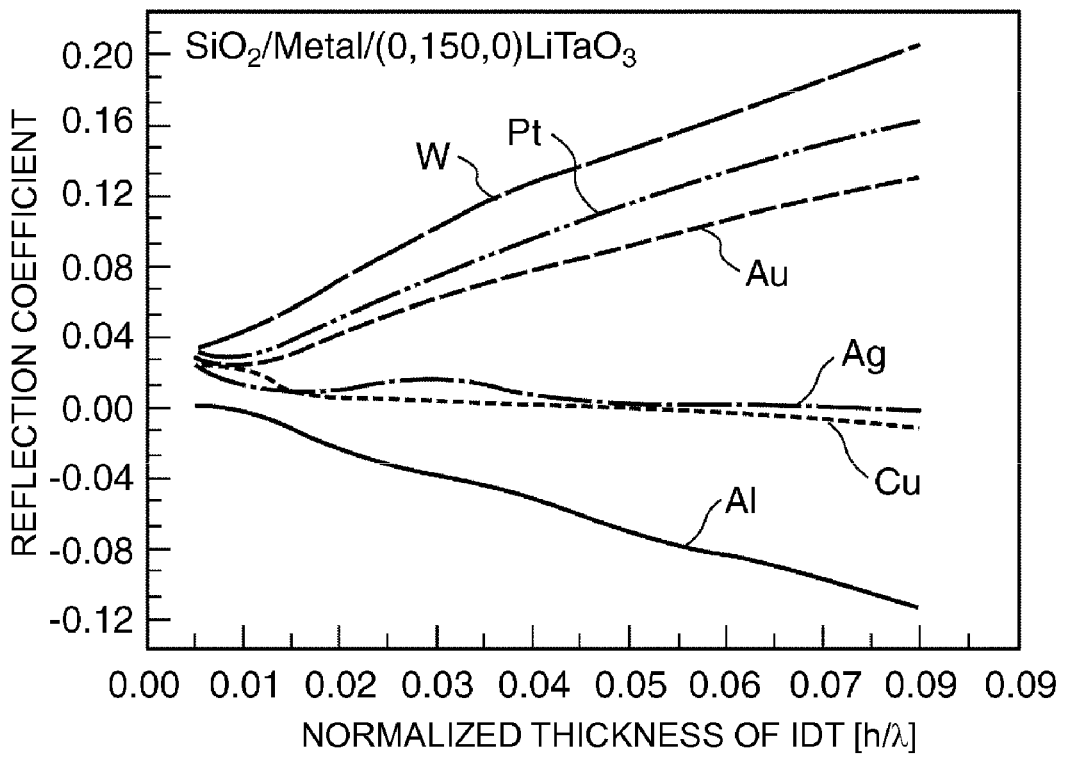
FIG. 27 is a view showing the relationship between the normalized thickness H/λ of an IDT and the reflection coefficient in each of surface acoustic wave devices in which LiTaO₃ substrates each having Euler angles (0°, 150°, 0°) are used, various metals are filled in upper surface grooves of the LiTaO₃ substrates, and SiO₂ films are each further formed to have a normalized thickness of about 0.25.
Figure 28:
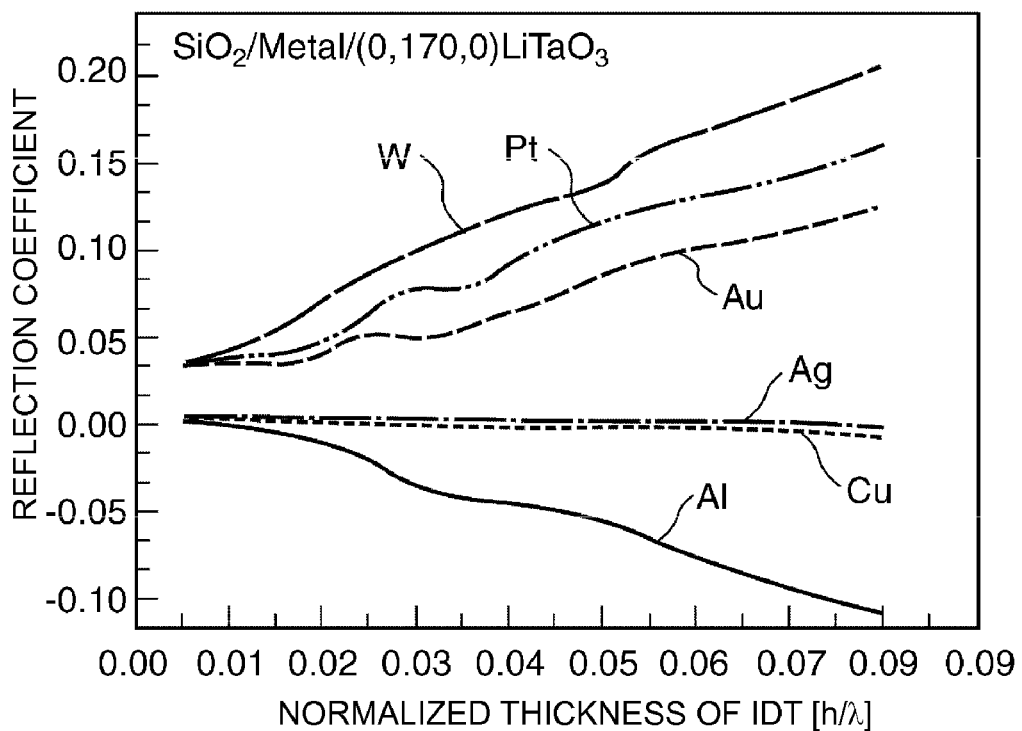
FIG. 28 is a view showing the relationship between the normalized thickness H/λ of an IDT and the reflection coefficient in each of surface acoustic wave devices in which LiTaO₃ substrates each having Euler angles (0°, 170°, 0°) are used, various metals are filled in upper surface grooves of the LiTaO₃ substrates, and SiO₂ films are each further formed to have a normalized thickness of about 0.25.

In addition, FIGS. 26 to 28 are views showing changes in the reflection coefficient with changes in the normalized thickness H/λ of an IDT which are obtained when LiTaO3 substrates having Euler angles (0°, 110°, 0°), (0°, 150°, 0°), and (0°, 170°, 0°) are used. The normalized thickness of the SiO₂ film was set to about 0.25.

As shown in FIGS. 26 to 28, as in the cases in which the Euler angles are (0°, 126°, 0°) and (0°, 90°, 0°), when the Euler angles are (0°, 110°, 0°), (0°, 150°, 0°), and (0°, 170°, 0°), when a metal heavier than Ag is used, the reflection coefficient has a positive value, and the absolute value of the reflection coefficient is increased as the thickness of the IDT is increased.

That is, when the IDT is formed by filling a metal heavier than Ag in grooves provided in a LiTaO₃ substrate without depending on the Euler angles, as in the preferred embodiments described above, the reflection coefficient has a positive value, the absolute value thereof is increased, and the electromechanical coupling coefficient $k^2$ can be increased.

Figure 29:
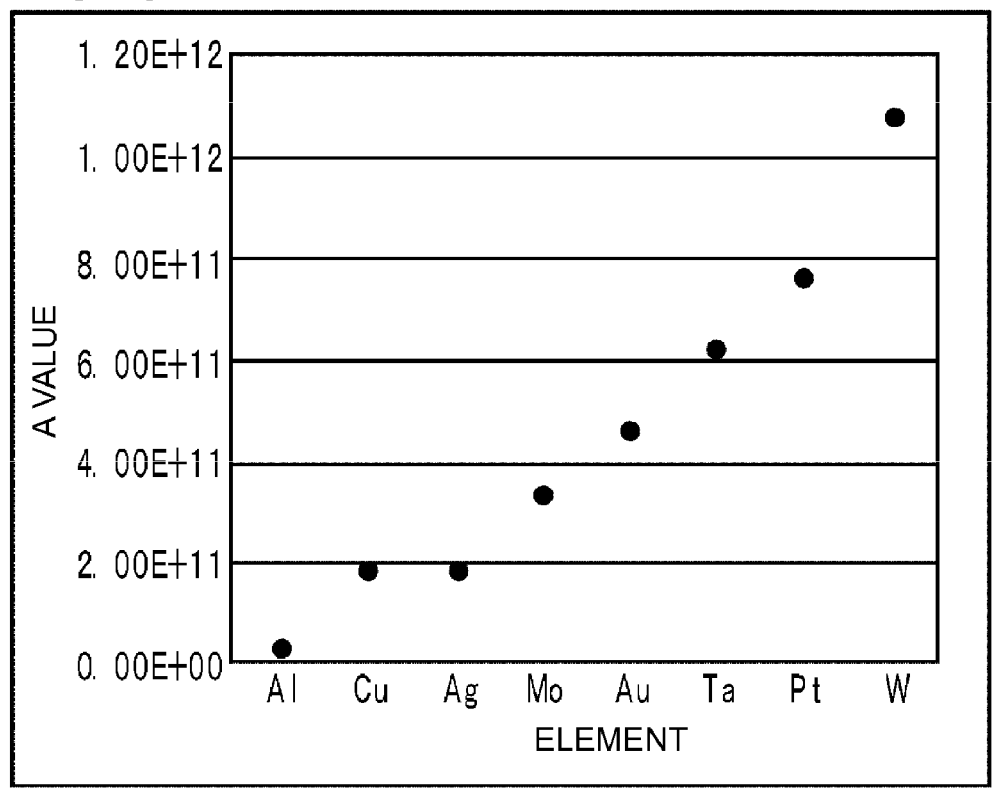
FIG. 29 is a view showing various metal elements and A values shown in Table 1.
Figure 30:
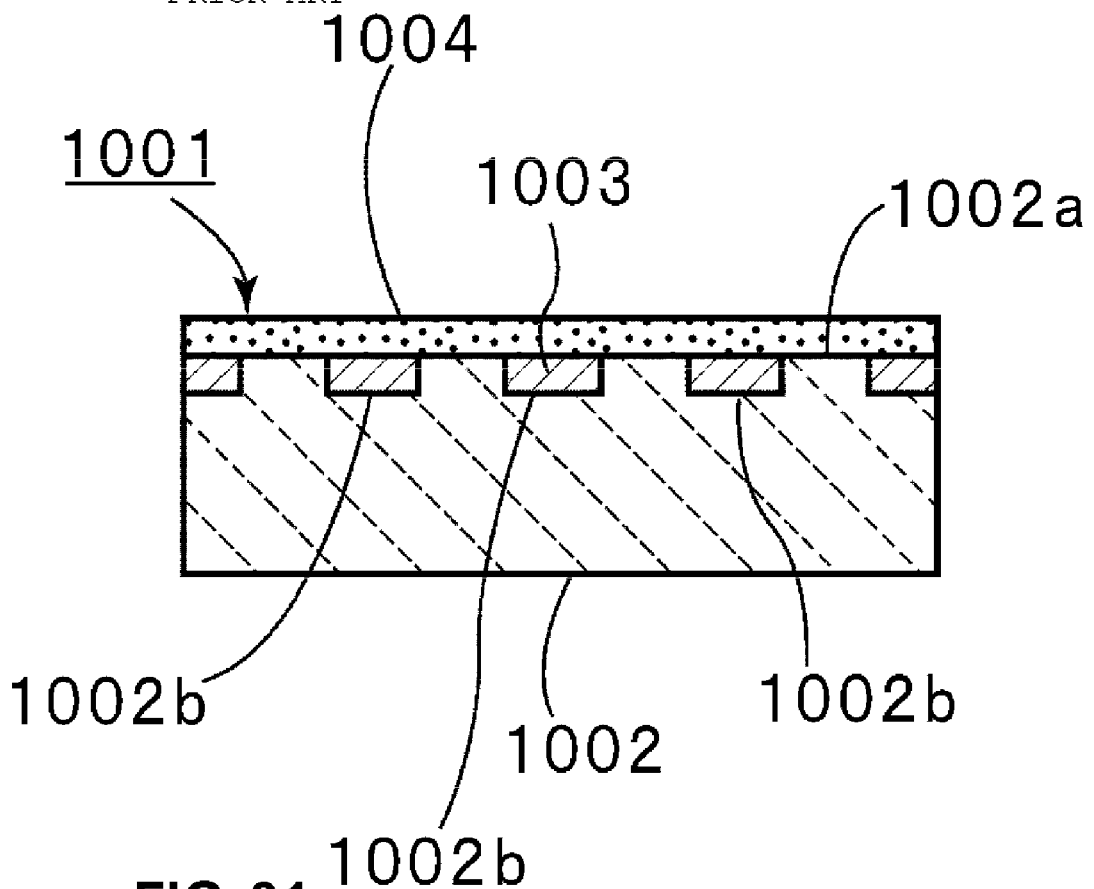
FIG. 30 is a schematic front cross-sectional view illustrating one example of a conventional surface acoustic wave device.

In addition, in the preferred embodiments described above, the reason that the metal is selected so as to satisfy the equation (1) is as follows. That is, in order to obtain the advantages described above, a metal that is merely heavier than Ag may not be suitable for use, however, a metal that satisfies the above equation (1) is preferably used. That is, as shown in FIGS. 6 to 24, in the case of Mo having a density of 10,219 kg/m³ which is less than the density of 10,500 kg/m³ of Ag, an advantageous result can also be obtained. That is, when Mo is used, the absolute value of the reflection coefficient is higher than the reflection coefficient that is obtained by using Ag, and a positive reflection coefficient can also be obtained. Thus, in addition to the density of the metal, other parameters were also investigated. As a result, since the densities of Al, Cu, Ag, Mo, Au, Ta, Pt, and W, the stiffnesses $C_{44}$, and the left-hand side of equation (1), that is, $A=(\rho^3 \times C_{44})^{1/2} > 1.95 \times 10^{11}$, have the relationship shown in the following Table 1 and in FIG. 29, it was discovered that the A value may be greater than $1.95 \times 10^{11}$, that is, a metal which can satisfy the above equation (1) may be used.

TABLE 1

|    | Density kg/m³ | $C_{44}$ [N/m²] | $A = \sqrt{(\rho^3 \times C_{44})}$ |
|----|---------------|-----------------|-------------------------------------|
| Al | 2699  | 2.61E+10 | 2.27E+10 |
| Cu | 8930  | 5.14E+10 | 1.91E+11 |
| Ag | 10500 | 3.29E+10 | 1.95E+11 |
| Mo | 10219 | 1.07E+11 | 3.38E+11 |
| Au | 19300 | 2.99E+10 | 4.64E+11 |
| Ta | 16678 | 8.25E+10 | 6.19E+11 |
| Pt | 21400 | 5.97E+10 | 7.65E+11 |
| W  | 19265 | 1.60E+11 | 1.07E+12 |

In addition, according to preferred embodiments of the present invention, although the Euler angles ($\phi$, $\theta$, $\Psi$) of LiTaO₃ are not particularly limited as described above, when a Rayleigh wave and an SH wave are used as the surface acoustic wave, it is preferable that the Euler angle $\phi$ be set in the range of 0°±10°, for example, the Euler angle $\theta$ be set in the range of 70°~180°, for example, and the Euler angle $\Psi$ be set in the range of 0°±10°, for example. That is, when the Euler angles are in the range of (0°±10°, 70°~180°, 0°±10°), for example, a Rayleigh wave and an SH wave can preferably be used. More preferably, in the range of (0°±10°, 90°~180°, 0°±10°), for example, an SH wave can be preferably used.

In addition, a LSAW wave may also preferably be used, and in this case, the Euler angles may preferably be set in the range of (0°±10°, 110°~160°, 0°±10°), for example. In addition, in the preferred embodiments described above, although the electrode structure of the one-port type SAW resonator is shown, as an example, the surface acoustic wave device according to preferred embodiments of the present invention may be widely applied to other resonator structures or other resonator type surface acoustic wave filters.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
   a piezoelectric substrate composed of a LiTaO₃ substrate and including a plurality of grooves provided in an upper surface thereof;
   an IDT including a plurality of electrode fingers which are defined by a metal filled in the plurality of grooves in the upper surface of the piezoelectric substrate; wherein
   the metal is at least one metal selected from the group consisting of Mo, Ta, Au, and Pt or an alloy primarily composed of the metal; and
   the metal satisfies the following equation (1):

$$(\rho^3 \times C_{44})^{1/2} > 1.95 \times 10^{11} \qquad \text{Equation (1)}$$

where $\rho$ (kg/m³) represents the density of the metal, and $C_{44}$ (N/M²) represents the stiffness thereof.

2. The surface acoustic wave device according to claim 1, further comprising a dielectric film including SiO₂ or an inorganic material primarily including SiO₂ and being arranged to cover the IDT and the piezoelectric substrate.

3. The surface acoustic wave device according to claim 2, wherein when a wavelength of a surface acoustic wave is represented by $\lambda$, a normalized thickness of the dielectric film which is normalized by $\lambda$ is about 0.05 to about 0.3.

4. The surface acoustic wave device according to claim 1, wherein the cut angle of the LiTaO₃ substrate is expressed in Euler angles (0°±10°, 70°~180°, 0°±10°).

5. A surface acoustic wave device comprising:
   a piezoelectric substrate composed of a LiTaO₃ substrate and including a plurality of grooves provided in an upper surface thereof;
   an IDT including a plurality of electrode fingers which are disposed in the plurality of grooves in the upper surface of the piezoelectric substrate; wherein
   the IDT is defined by a laminated metal film including metal films laminated to each other, and each of the metal films is composed of a metal selected from the group consisting of Al, Au, Ta, W, Pt, Cu, Ni, and Mo; and
   the laminate metal film satisfies the following equation (1):

$$(\rho^3 \times C_{44})^{1/2} > 1.95 \times 10^{11} \qquad \text{Equation (1)}$$

where the quotient obtained by dividing the sum of the products of thicknesses T of the metal films and the densities of the metals composing the metal films by the sum of the thicknesses T of the metal films is defined as an average density and is represented by the $\rho$ (kg/m³), and where an average stiffness, which is the quotient obtained by dividing the sum of the products of the thicknesses T of the metal films and the stiffnesses of the metals composing the metal films by the sum of the thicknesses T of the metal films, and the metal films defining the laminated metal film, is represented by the $C_{44}$ (N/M²).

* * * * *